(12) United States Patent
Viehmann et al.

(10) Patent No.: US 11,714,354 B2
(45) Date of Patent: Aug. 1, 2023

(54) LITHOGRAPHIC PRINTING PLATE PRECURSOR AND METHOD OF USE

(71) Applicant: Eastman Kodak Company, Rochester, NY (US)

(72) Inventors: Philipp Viehmann, Gottingen (DE); Saija Werner, Hattorf (DE); Christopher D. Simpson, Osterode (DE); Stefanie Hansmann, Osterode (DE)

(73) Assignee: EASTMAN KODAK COMPANY, Rochester, NY (US)

( * ) Notice: Subject to any disclaimer, the term of this patent is extended or adjusted under 35 U.S.C. 154(b) by 266 days.

(21) Appl. No.: 17/097,164

(22) Filed: Nov. 13, 2020

(65) Prior Publication Data

US 2021/0302834 A1    Sep. 30, 2021

Related U.S. Application Data

(60) Provisional application No. 62/994,366, filed on Mar. 25, 2020.

(51) Int. Cl.
*G03F 7/004* (2006.01)
*G03F 7/09* (2006.01)

(52) U.S. Cl.
CPC .......... *G03F 7/0044* (2013.01); *G03F 7/0045* (2013.01); *G03F 7/092* (2013.01)

(58) Field of Classification Search
CPC ...... G03F 7/0045; G03F 7/092; G03F 7/0044; B41C 1/1008; B41C 2210/22; B41C 2210/04; C07F 5/025
See application file for complete search history.

(56) References Cited

U.S. PATENT DOCUMENTS

| | | | |
|---|---|---|---|
| 5,008,238 A | 4/1991 | Gotoh et al. | |
| 5,491,045 A * | 2/1996 | DeBoer | B41M 5/24 503/227 |
| 7,524,614 B2 | 4/2009 | Tao et al. | |
| 7,553,603 B2 | 6/2009 | Iftime et al. | |
| 7,723,010 B2 | 5/2010 | Nguyen et al. | |
| 7,770,534 B2 | 8/2010 | Cooperman | |
| 7,910,768 B2 | 3/2011 | Nguyen et al. | |
| 7,955,682 B2 | 6/2011 | Gore | |
| 8,021,827 B2 | 9/2011 | Nguyen et al. | |
| 8,323,867 B2 | 12/2012 | Nguyen et al. | |
| 9,034,090 B2 | 5/2015 | Kozee et al. | |
| 2005/0123853 A1 * | 6/2005 | Munnelly | G03F 7/033 430/270.1 |
| 2005/0170282 A1 | 8/2005 | Inno et al. | |
| 2006/0269874 A1 | 11/2006 | Huang et al. | |
| 2009/0047599 A1 | 2/2009 | Horne et al. | |
| 2016/0259243 A1 | 9/2016 | Hayakawa et al. | |
| 2017/0217149 A1 | 8/2017 | Hayashi et al. | |
| 2018/0155483 A1 | 6/2018 | Kohl et al. | |
| 2018/0356730 A1 | 12/2018 | Inasaki et al. | |
| 2019/0329545 A1 * | 10/2019 | Shibamoto | C08F 2/48 |
| 2019/0369495 A1 * | 12/2019 | Ishiji | C07C 311/48 |
| 2020/0096865 A1 | 3/2020 | Igarashi et al. | |

FOREIGN PATENT DOCUMENTS

| | | |
|---|---|---|
| EP | 2 018 365 B1 | 11/2014 |
| EP | 2839968 A1 | 2/2015 |
| EP | 3594009 A1 | 1/2020 |
| JP | 5704720 B2 | 4/2015 |
| JP | 2018100340 A | 6/2018 |
| WO | WO2012/115124 A1 | 8/2012 |
| WO | WO2012/133382 A1 | 10/2012 |
| WO | WO2013/047228 A1 | 4/2013 |
| WO | WO2013/047229 A1 | 4/2013 |
| WO | WO2015/046298 A1 | 4/2015 |
| WO | 2020/060784 A1 | 3/2020 |

OTHER PUBLICATIONS

Gabriel Canard, et al.; Influence of the electron donor groups on the optical and electrochemical properties of boron difluoride complexes ofcurcuminoid derivatives: a joint theoretical and experimental study, Jan. 28, 2017, Royal Society of Chemistry, vol. 7, 10132-10143 (Year: 2017).*
Supplemental Information Document to Canard et al. (Year: 2017).*
Technical Data Sheet: "Sulisobenzone" from MFCI (Year: 2018).*
Katherine Lawrence, et al, "A simple and effective colorimetric technique for the detection of boronic acids and their derivatives," Analytical Methods, vol. 4, No. 8, 2012, p. 2215.

* cited by examiner

*Primary Examiner* — Pamela H Weiss
*Assistant Examiner* — Andrew Preston Traywick
(74) *Attorney, Agent, or Firm* — J. Lanny Tucker

(57) ABSTRACT

IR-sensitive lithographic printing plate precursors provide a stable print-out image using a unique IR radiation-sensitive composition. This IR radiation-sensitive composition includes: a) free radically polymerizable component; an b) IR radiation absorber; c) an initiator composition; a d) borate compound; and a e) compound capable of forming a colored boronic complex during or after exposure of the infrared radiation-sensitive image-recording layer to infrared radiation. The resulting print-out image exhibits an excellent color contrast between the exposed and non-exposed regions. After IR imaging, these precursors can be developed off-press or on-press.

17 Claims, No Drawings

LITHOGRAPHIC PRINTING PLATE PRECURSOR AND METHOD OF USE

RELATED APPLICATION

The present application is related to provisional application U.S. Ser. No. 62/994,366, filed Mar. 25, 2020 by Viehmann, Werner, Simpson, and Hansmann.

FIELD OF THE INVENTION

This invention relates to infrared radiation-sensitive lithographic printing plate precursors that can be imaged using infrared radiation to provide imaged lithographic printing plates. Such precursors include unique infrared radiation-sensitive compositions that provide a stable printout image between exposed and non-exposed regions in the imagewise exposed infrared radiation-sensitive image-recording layer. This invention also relates to methods of using these precursors to provide lithographic printing plates having excellent printout images.

BACKGROUND OF THE INVENTION

In lithographic printing, lithographic ink receptive regions, known as image areas, are generated on a hydrophilic surface of a planar substrate such as an aluminum-containing substrate. When the printing plate surface is moistened with water and a lithographic printing ink is applied, hydrophilic regions retain the water and repel the lithographic printing ink, and the lithographic ink receptive image regions accept the lithographic printing ink and repel the water. The lithographic printing ink is transferred to the surface of a material upon which the image is to be reproduced, perhaps with the use of a blanket roller in a printing press.

Negative-working lithographic printing plate precursors useful to prepare lithographic printing plates typically comprise a negative-working radiation-sensitive image-recording layer disposed over the hydrophilic surface of the substrate. Such an image-recording layer includes radiation-sensitive components that can be dispersed in a suitable polymeric binder material. After the precursor is imagewise exposed to suitable radiation to form exposed regions and non-exposed regions in the image-recording layer, the non-exposed regions are removed by suitable means, revealing the underlying hydrophilic surface of the substrate. The exposed regions of the image-recording layer that are not removed are lithographic ink-receptive, and the hydrophilic substrate surface revealed by the developing process accepts water and aqueous solutions such as a fountain solution and repels lithographic printing ink.

In recent years, there has been an increased desire in the lithographic printing industry for simplification in making lithographic printing plates by carrying out development on-press ("DOP") using a lithographic printing ink or fountain solution, or both, to remove non-exposed regions of the image-recording layer. Thus, use of on-press developable lithographic printing plate precursors is being adopted more and more in the printing industry due to many benefits, including less environmental impact and savings on processing chemicals, processor floor space, and operation and maintenance costs. After laser imaging, on-press developable precursors can be taken directly to lithographic printing presses.

It is highly desirable that the imaged lithographic printing plate precursors have different colors in the exposed regions and non-exposed regions of the image-recording layer for readability before going to the printing press. The color difference between the exposed regions and the non-exposed regions is typically called "printout," "print-out," or a "print-out image." A strong printout image will make it easier for operators to visually identify the imaged lithographic printing plate precursors and to properly attach them to printing press units.

Many approaches have been taken in the industry to improve the printout of on-press developable printing plate precursors both immediately after imaging and after storage in the dark. They all have weaknesses.

Conventionally developed precursors using an aqueous developer (wet processing) have been designed with incorporated colorants to ensure high contrast between the ink receptive region where the colorant-containing imageable layer is retained and the hydrophilic support surface where the colorant-containing imageable layer is removed during wet processing. Such high contrast is needed for readability by the eye as well as by automatic camera systems. However, for on-press developable precursors, the imageable layer is not removed anywhere before the precursors are mounted on to a printing press and thus printout image must be generated. The printout image is usually based on acid-sensitive leuco dyes that can be switched by protons generated by radiation to form a color difference between exposed regions and non-exposed regions. The contrast generated by this concept is much lower than the contrast obtained in wet processed plates and tends to fade due to reverse reaction of the color-forming reaction or other unwanted reactions. Therefore, an improvement is needed to achieve a printout image that is strong and does not fade during storage in the dark.

U.S. Patent Application Publication 2020/0096865 (Igarashi et al.) describes negative-working lithographic printing plate precursors that exhibit improved printout image because of the presence of an acid generator, a tetraaryl borate, an acid-sensitive dye precursor, and an aromatic diol having an electron withdrawing substituent. In such an imageable composition, the primary color formation reaction still involves the acid-sensitive dye precursor and proton generated during exposure to imaging radiation. While the printout values are improved by the presence of the aromatic diol, significant fading still occurs.

There is a desire to improve the printout image beyond the level as produced using acid generators and acid-sensitive color precursors such as lactone base dyes because those printout images may not be strong enough due to inefficient acid generation using infrared radiation-sensitive imaging compositions followed by on-press development. Moreover, the concentration of protons generated during infrared radiation imaging often decreases after imaging through chemical equilibration or other post-imaging chemical reactions. As a result, the printout image based on proton-induced color change often fades after imaging.

Thus, there is a need to produce stable printout images using a color precursor that changes color through reactions with chemical species other than protons created during infrared radiation imaging.

SUMMARY OF THE INVENTION

The present invention provides a lithographic printing plate precursor comprising a substrate, and an infrared radiation-sensitive image-recording layer disposed on the substrate, the infrared radiation-sensitive image-recording layer comprising:

a) a free radically polymerizable component;
b) an infrared radiation absorber;
c) an initiator composition capable of generating free radicals;
d) a borate compound; and
e) a compound capable of forming a colored boronic complex during or after exposure of the infrared radiation-sensitive image-recording layer to infrared radiation,
where the borate compound is represented by the following structure (I)

$$B^-(R^1)(R^2)(R^3)(R^4)Z^+ \qquad (I)$$

wherein $R^1$, $R^2$, $R^3$, and $R^4$ independently represent optionally substituted alkyl, aryl, alkenyl, alkynyl, cycloalkyl, or heterocyclic groups attached to the boron atom of the borate anion, or two or more of $R^1$, $R^2$, $R^3$, and $R^4$ can be joined together to form a heterocyclic ring with the boron atom, such heterocyclic ring having up to 7 carbon, nitrogen, oxygen, or sulfur atoms; and $Z^+$ is a cation to balance the electric charge of the borate anion.

In addition, the present invention provides a method for providing a lithographic printing plate, comprising:

A) imagewise exposing the lithographic printing plate precursor according to any embodiment of the present invention to infrared radiation, to provide exposed regions and non-exposed regions in the infrared radiation-sensitive image-recording layer, and B) removing the non-exposed regions in the infrared radiation-sensitive image-recording layer from the substrate.

The present invention provides a printout image from the colored boronic complex generated in the imageable layer in the region exposed to imaging infrared radiation during or after imaging exposure. Such a printout image is strong and does not fade during dark storage.

DETAILED DESCRIPTION OF THE INVENTION

The following discussion is directed to various embodiments of the present invention and while some embodiments can be desirable for specific uses, the disclosed embodiments should not be interpreted or otherwise considered to limit the scope of the present invention, as claimed below. In addition, one skilled in the art will understand that the following disclosure has broader application than is explicitly described in the discussion of any specific embodiment.

Definitions

As used herein to define various components of the infrared radiation-sensitive image-recording layer, and other materials used in the practice of this invention, unless otherwise indicated, the singular forms "a," "an," and "the" are intended to include one or more of the components (that is, including plurality referents).

Each term that is not explicitly defined in the present application is to be understood to have a meaning that is commonly accepted by those skilled in the art. If the construction of a term would render it meaningless or essentially meaningless in its context, the term should be interpreted to have a standard dictionary meaning.

The use of numerical values in the various ranges specified herein, unless otherwise expressly indicated, are to be considered as approximations as though the minimum and maximum values within the stated ranges were both preceded by the word "about." In this manner, slight variations above and below the stated ranges may be useful to achieve substantially the same results as the values within the ranges. In addition, the disclosure of these ranges is intended as a continuous range including every value between the minimum and maximum values as well as the end points of the ranges.

Unless the context indicates otherwise, when used herein, the terms "lithographic printing plate precursor," "precursor," and "IR-sensitive lithographic printing plate precursor" are meant to be equivalent references to embodiments of the present invention.

As used herein, the term "infrared radiation absorber" refers to a compound or material that absorbs electromagnetic radiation in the near-infrared (near-IR) and infrared (IR) regions of the electromagnetic spectrum, and it typically refers to compounds or materials that have an absorption maximum in the near-IR and IR regions.

As used herein, the terms "near-infrared region" and "infrared region" refer to radiation having a wavelength of at least 750 nm and higher. In most instances, the terms are used to refer to the region of the electromagnetic spectrum of at least 750 nm and more likely of at least 750 nm and up to and including 1400 nm.

For the purposes of this invention, the strength of printout images is generally indicated by $\Delta E$, which is the Euclidean distance in CIE 1976 L*a*b* color space between the colors of radiation-exposed region and radiation non-exposed region measured from reflection measurement in 45/0 geometry (non-polarized), using CIE 2° observer and D50 as illuminant according to EN ISO 11664-4 "Colorimetry—Part 4: CIE 1976 L*a*b* Colour space." and other known references. Color measurements can be done using commercial instruments such as Techkon SpectroDens. In CIE 1976 L*a*b color space, a color is expressed as three numerical color values: L* for the lightness (or brightness) of the color, a* for the green-red component of the color, and b* for the blue-yellow component of the color values.

For the purpose of this invention, visible spectral region refers to a spectral region for electromagnetic radiation having a wavelength from 400 nm to 700 nm.

For clarification of definitions for any terms relating to polymers, reference should be made to "Glossary of Basic Terms in Polymer Science" as published by the International Union of Pure and Applied Chemistry ("IUPAC"), *Pure Appl. Chem.* 68, 2287-2311 (1996). However, any definitions explicitly set forth herein should be regarded as controlling.

As used herein, the term "polymer" is used to describe compounds with relatively large molecular weights formed by linking together many small reactive monomers to form recurring units of the same chemical composition. These polymer chains usually form coiled structures in a random fashion. With the choice of solvents, a polymer can become insoluble as the chain length grows and become polymeric particles dispersed in the solvent medium. These particle dispersions can be very stable and useful in infrared radiation-sensitive imageable layers described for use in the present invention. In this invention, unless indicated otherwise, the term "polymer" refers to a non-crosslinked material. Thus, crosslinked polymeric particles differ from the non-crosslinked polymeric particles in that the latter can be dissolved in certain organic solvents of good solvating property whereas the crosslinked polymeric particles may swell but do not dissolve in the organic solvent because the polymer chains are connected by strong covalent bonds.

The term "copolymer" refers to polymers composed of two or more different repeating or recurring units that are arranged along the polymer chain.

The term "backbone" refers to the chain of atoms in a polymer to which a plurality of pendant groups can be attached. An example of such a backbone is an "all carbon" backbone obtained from the polymerization of one or more ethylenically unsaturated polymerizable monomers.

As used herein, the term "ethylenically unsaturated polymerizable monomer" refers to a compound comprising one or more ethylenically unsaturated (—C═C—) bonds that are polymerizable using free radical or acid-catalyzed polymerization reactions and conditions. It is not meant to refer to chemical compounds that have only unsaturated —C═C— bonds that are not polymerizable under these conditions.

Unless otherwise indicated, the term "weight %" refers to the amount of a component or material based on the total solids of a composition, formulation, or layer. Unless otherwise indicated, the percentages can be the same for either a dry layer or the total solids of the formulation or composition.

As used herein, the term "layer" or "coating" can consist of one disposed or applied layer or a combination of several sequentially disposed or applied layers. If a layer is considered infrared radiation-sensitive and negative-working, it is both sensitive to infrared radiation (as described above for "infrared radiation-absorber") and negative-working in the formation of lithographic printing plates.

As used herein, the terms "on-press developable" and "on-press developability" refer to the capability of developing a precursor according to the present invention after infrared radiation exposing (imaging), by mounting the imaged precursor on a suitable printing press, and carrying out development during the first few printed impressions using a fountain solution, a lithographic printing ink, or a combination of a fountain solution and a lithographic printing ink.

Uses

The lithographic printing plate precursors according to the present invention are useful for providing lithographic printing plates that exhibit desirable printout images after imagewise exposure. These lithographic printing plates are useful for lithographic printing during press operations. Lithographic printing plates can be prepared using on-press or off-press processing according to this invention. The lithographic printing plate precursors are prepared with the structure and components described as follows.

Lithographic Printing Plate Precursors

The precursors according to the present invention can be formed by suitable application of an infrared radiation-sensitive image-recording composition (as described below) to a suitable substrate (as described below) to form an infrared radiation-sensitive image recording layer that is negative-working. In general, the infrared radiation-sensitive image-recording composition (and resulting infrared radiation-sensitive image-recording layer) comprises: a) one or more free radically polymerizable components; b) one or more infrared radiation absorbers; c) an initiator composition; d) one or more borate compounds; and e) one or more compounds, each of which is capable of forming a colored boronic complex during or after exposure of the infrared radiation-sensitive image-recording layer to infrared radiation; and optionally, f) a non-free radically polymerizable polymeric material different from all of the a), b), c), d), and e) components defined herein. In some highly useful embodiments, the infrared radiation-sensitive image recording layer consists essentially of the noted components a) through e) as the only essential components needed to provide a desired lithographic image with desirable printout image.

There is generally only one infrared radiation-sensitive image-recording layer in each precursor. This layer is generally the outermost layer in the precursor, but in some embodiments, there can be an outermost water-soluble hydrophilic protective layer (also known as a topcoat or oxygen barrier layer), as described below, disposed over (or directly on and in contact with) the infrared radiation-sensitive image-recording layer.

Substrate:

The substrate that is used to prepare the precursors according to this invention generally has a hydrophilic imaging-side surface, or at least a surface that is more hydrophilic than the applied infrared radiation-sensitive image-recoding layer. The substrate generally comprises an aluminum-containing support that can be composed of raw aluminum or a suitable aluminum alloy that is conventionally used to prepare lithographic printing plate precursors.

The aluminum-containing substrate can be treated using techniques known in the art, including roughening of some type by physical (mechanical) graining, electrochemical graining, or chemical graining, which is followed by one or more anodizing treatments. Each anodizing treatment is typically carried out using either phosphoric or sulfuric acid and conventional conditions to form a desired hydrophilic aluminum oxide (or anodic oxide) layer on the aluminum-containing support. A single aluminum oxide (anodic oxide) layer can be present or multiple aluminum oxide layers having multiple pores with varying depths and shapes of pore openings can be present. Such processes thus provide an anodic oxide layer(s) or aluminum oxide layer(s) underneath an infrared radiation-sensitive image-recording layer that can be provided as described below. A discussion of such pores and a process for controlling their width is described for example, in U.S. Patent Publications 2013/0052582 (Hayashi), 2014/0326151 (Namba et al.), and 2018/0250925 (Merka et al.), and U.S. Pat. No. 4,566,952 (Sprintschuik et al.), 8,789,464 (Tagawa et al.), 8,783,179 (Kurokawa et al.), and 8,978,555 (Kurokawa et al.), the disclosures of all of which are incorporated herein by reference, as well as in EP 2,353,882 (Tagawa et al.). Teaching about providing two sequential anodizing treatments to provide different aluminum oxide layers in an improved substrate are described for example, in U.S. Patent Application Publication 2018/0250925 (Merka et al.), the disclosure of which is incorporated herein by reference.

Sulfuric acid anodization of the aluminum support generally provides an aluminum (anodic) oxide weight (coverage) on the surface of at least 1 $g/m^2$ and up to and including 5 $g/m^2$ and more typically of at least 3 $g/m^2$ and up to and including 4 $g/m^2$. Phosphoric acid anodization generally provides an aluminum (anodic) oxide weight on the surface of from at least 0.5 $g/m^2$ and up to and including 5 $g/m^2$ and more typically of at least 1 $g/m^2$ and up to and including 3 $g/m^2$.

An anodized aluminum-containing support can be further treated to seal the anodic oxide pores or to hydrophilize its surface, or both, using known post-anodic treatment processes, such as post-treatments using aqueous solutions of poly(vinyl phosphonic acid) (PVPA), vinyl phosphonic acid copolymers, poly[(meth)acrylic acid] or its alkali metal salts, or (meth)acrylic acid copolymers or their alkali metal salts, mixtures of phosphate and fluoride salts, or sodium silicate. The post-treatment process materials can also comprise unsaturated double bonds to enhance adhesion between the treated surface and the overlying infrared radiation exposed regions. Such unsaturated double bonds can be provided in low molecular weight materials or they can be present within side chains of polymers. Useful post-treatment processes include dipping the substrate with rinsing, dipping the substrate without rinsing, and various coating techniques such as extrusion coating.

An anodized aluminum-containing substrate can be treated with an alkaline or acidic pore-widening solution to provide an anodic oxide layer containing columnar pores. In some embodiments, the treated aluminum-containing substrate can comprise a hydrophilic layer disposed directly on a grained, anodized, and post-treated aluminum-containing support, and such hydrophilic layer can comprise a non-crosslinked hydrophilic polymer having carboxylic acid side chains.

The thickness of a substrate can be varied but should be sufficient to sustain the wear from printing and thin enough to be wrapped around a printing form. Useful embodiments include a treated aluminum foil having a thickness of at least 100 μm and up to and including 700 μm. The backside (non-imaging side) of the substrate can be coated with antistatic agents, a slipping layer, or a matte layer to improve handling and "feel" of the precursor.

The substrate can be formed as a continuous roll (or continuous web) of sheet material that is suitably coated with an infrared radiation-sensitive image-recording layer formulation and optionally a hydrophilic protective layer formulation, followed by slitting or cutting (or both) to size to provide individual lithographic printing plate precursors having a shape or form having four right-angled corners (thus, typically in a square or rectangular shape or form). Typically, the cut individual precursors have a planar or generally flat rectangular shape.

Infrared Radiation-Sensitive Image-Recording Layer:

The infrared radiation-sensitive recording layer composition (and infrared radiation-sensitive image-recording layer prepared therefrom) according to the present invention is designed to be "negative-working" as that term is known in the lithographic art. In addition, the infrared radiation-sensitive image-recording layer can be designed with a certain combination of components to provide on-press developability to the lithographic printing plate precursor after exposure, for example to enable development using a fountain solution, a lithographic printing ink, or a combination of the two.

The infrared radiation-sensitive image-recording layer used in the practice of the present invention comprises a) one or more free radically polymerizable components, each of which contains one or more free radically polymerizable groups that can be polymerized using free radical initiation during infrared radiation exposure. In some embodiments, at least two a) free radically polymerizable components, having the same or different numbers of free radically polymerizable groups in each molecule, are present. Thus, useful a) free radically polymerizable components can contain one or more free radical polymerizable monomers or oligomers having one or more polymerizable ethylenically unsaturated groups (for example, two or more of such groups). Similarly, crosslinkable polymers having such free radically polymerizable groups can also be used. Oligomers or prepolymers, such as urethane acrylates and methacrylates, epoxide acrylates and methacrylates, polyester acrylates and methacrylates, polyether acrylates and methacrylates, and unsaturated polyester resins can be used. In some embodiments, the free radically polymerizable component comprises carboxyl groups.

It is possible for one or more a) free radically polymerizable components to have large enough molecular weight or to have sufficient polymerizable groups to provide a crosslinkable polymer matrix that functions as a "polymeric binder" for other components in the infrared radiation-sensitive image-recording layer. In such embodiments, a distinct f) non-free radically polymerizable polymer material (described below) is not necessary but can still be present if desired.

Free radically polymerizable components include urea urethane (meth)acrylates or urethane (meth)acrylates having multiple (two or more) polymerizable groups. Mixtures of such compounds can be used, each compound having two or more unsaturated polymerizable groups, and some of the compounds having three, four, or more unsaturated polymerizable groups. For example, a free radically polymerizable component can be prepared by reacting DESMODUR® N100 aliphatic polyisocyanate resin based on hexamethylene diisocyanate (Bayer Corp., Milford, Conn.) with hydroxyethyl acrylate and pentaerythritol triacrylate. Useful free radically polymerizable compounds include NK Ester A-DPH (dipentaerythritol hexaacrylate) that is available from Kowa American, and Sartomer 399 (dipentaerythritol pentaacrylate), Sartomer 355 (di-trimethylolpropane tetraacrylate), Sartomer 295 (pentaerythritol tetraacrylate), and Sartomer 415 [ethoxylated (20)trimethylolpropane triacrylate] that are available from Sartomer Company, Inc.

Numerous other a) free radically polymerizable components are known in the art and are described in considerable literature including *Photoreactive Polymers: The Science and Technology of Resists*, A Reiser, Wiley, New York, 1989, pp. 102-177, by B. M. Monroe in *Radiation Curing: Science and Technology*, S. P. Pappas, Ed., Plenum, New York, 1992, pp. 399-440, and in "Polymer Imaging" by A. B. Cohen and P. Walker, in *Imaging Processes and Material*, J. M. Sturge et al. (Eds.), Van Nostrand Reinhold, New York, 1989, pp. 226-262. For example, useful free radically polymerizable components are also described in EP 1,182,033A1 (Fujimaki et al.), beginning with paragraph [0170], and in U.S. Pat. No. 6,309,792 (Hauck et al.), U.S. Pat. No. 6,569,603 (Furukawa), and U.S. Pat. No. 6,893,797 (Munnelly et al.) the disclosures of all of which are incorporated herein by reference. Other useful a) free radically polymerizable components include those described in U.S. Patent Application Publication 2009/0142695 (Baumann et al.), which radically polymerizable components include 1H-tetrazole groups, and the disclosure of which publication is incorporated herein by reference.

The one or more a) free radically polymerizable components are generally present in an amount of at least 10 weight % or of at least 20 weight %, and up to and including 50 weight %, or up to and including 70 weight %, all based on the total dry coverage of the infrared radiation-sensitive image-recording layer.

Useful a) free radically polymerizable components can be obtained from various commercial sources in the world, or they can be readily prepared using known starting materials and synthetic methods carried out by skilled synthetic chemists.

In addition, the infrared radiation-sensitive image-recording layer comprises one or more b) infrared radiation absorbers to provide desired infrared radiation sensitivity or to convert radiation to heat, or both. Useful infrared radiation absorbers can be pigments or infrared radiation absorbing dyes. Suitable dyes are those described in for example, U.S. Pat. No. 5,208,135 (Patel et al.), U.S. Pat. No. 6,153,356 (Urano et al.), U.S. Pat. No. 6,309,792 (Hauck et al.), U.S. Pat. No. 6,569,603 (Furukawa), U.S. Pat. No. 6,797,449 (Nakamura et al.), U.S. Pat. No. 7,018,775 (Tao), U.S. Pat. No. 7,368,215 (Munnelly et al.), U.S. Pat. No. 8,632,941 (Balbinot et al.), and U.S. Patent Application Publication 2007/056457 (Iwai et al.), the disclosures of all of which are incorporated herein by reference. In some infrared radiation-sensitive embodiments, it is desirable that at least one b) infrared radiation absorber in the infrared radiation-sensitive image-recording layer is a cyanine dye comprising a suitable cationic cyanine chromophore and a tetraarylborate anion such as a tetraphenylborate anion. Examples of such dyes include those described in United States Patent Application Publication 2011/003123 (Simpson et al.), the disclosure of which is incorporated herein by reference.

In addition to low molecular weight IR-absorbing dyes, IR dye chromophores bonded to polymers can be used as well. Moreover, IR dye cations can be used as well, that is, the cation is the IR absorbing portion of the dye salt that ionically interacts with a polymer comprising carboxy, sulfo, phospho, or phosphono groups in the side chains.

The total amount of one or more b) infrared radiation absorbers is at least 0.5 weight % or at least 1 weight %, and up to and including 15 weight %, or up to and including 30 weight %, based on the total dry coverage of the infrared radiation-sensitive image-recording layer.

Useful b) infrared radiation absorbers can be obtained from various commercial sources in the world, or they can be prepared using known chemical synthetic methods and starting materials that a skilled synthetic chemist would be able to carry out.

Moreover, the present invention utilizes c) an initiator composition that is present in the infrared radiation-sensitive image-recording layer. Such c) initiator composition can comprise one or more organohalogen compounds, for example trihaloallyl compounds; halomethyl triazines; bis(trihalomethyl) triazines; and at least one onium salt such as an iodonium salt, sulfonium salt, diazonium salt, phosphonium salt, and ammonium salt, many of which are known in the art as being capable of generating free radicals upon infrared radiation exposure. For example, representative compounds other than onium salts are described for example in [0087] to [0102] of U.S. Patent Application Publication 2005/0170282 (Inno et al., US '282) and U.S. Pat. No. 6,309,792 (Hauck et al.), the disclosures of both of which are incorporated herein by reference including the numerous cited publications describing such compounds, and also in Japanese Patent Publication 2002/107916 and WO 2019/179995.

Useful onium salts are described for example from [0103] to [0109] of the cited US '282. For example, useful onium salts comprise at least one onium cation in the molecule, and a suitable anion. Examples of the onium salts include diaryliodonium salts, triphenylsulfonium, diphenyliodonium, diphenyldiazonium, compounds and derivatives thereof that are obtained by introducing one or more substituents into the benzene ring of these compounds. Suitable substituents include but are not limited to, alkyl, alkoxy, alkoxycarbonyl, acyl, acyloxy, chloro, bromo, fluoro and nitro groups.

Examples of anions in onium salts include but are not limited to, halogen anions, $ClO_4^-$, $PF_6^-$, $BF_4^-$, $SbF_6^-$, $CH_3SO_3^-$, $CF_3SO_3^-$, $C_6H_5SO_3^-$, $CH_3C_6H_4SO_3^-$, $HOC_6H_4SO_3^-$, $ClC_6H_4SO_3^-$, and boron anions as described for example in U.S. Pat. No. 7,524,614 (Tao et al.), the disclosure of which is incorporated herein by reference.

Representative useful iodonium salts are described in U.S. Pat. No. 7,524,614 (noted above), in Cols. 6-7 wherein the iodonium cation can contain various listed monovalent substituents "X" and "Y," or fused carbocyclic or heterocyclic rings with the respective phenyl groups.

Useful onium salts can be polyvalent onium salts having at least two onium ions in the molecule that are bonded through a covalent bond. Among polyvalent onium salts, those having at least two onium ions in the molecule are useful and those having a sulfonium or iodonium cation in the molecule are useful.

Furthermore, the onium salts described in paragraphs [0033] to [0038] of the specification of Japanese Patent Publication 2002-082429 [or U.S. Patent Application Publication 2002-0051934 (Ippei et al.)], the disclosure of which is incorporated herein by reference] or the iodonium borate complexes described in U.S. Pat. No. 7,524,614 (noted above), in Cols. 6 and 7 can also be used.

Representative iodonium borate salts are for example, listed in Col. 8 of U.S. Pat. No. 7,524,614 (noted above).

In some embodiments, a combination of onium salts can be used as part of the c) initiator composition, for example a combination of compounds described as Compounds A and Compounds B in U.S. Patent Application Publication 2017/0217149 (Hayashi et al.), the disclosure of which is incorporated herein by reference.

Since the c) initiator composition can have multiple components it would be readily apparent to one skilled in the art as to the useful amount(s) or dry coverage of the various components of the c) initiator composition in the infrared radiation-sensitive image-recording layer, based on the knowledge of a skilled artisan and the representative teaching provided herein including the working Examples shown below. Useful c) initiator composition materials can be readily obtained from commercial sources in the world, or readily prepared using known starting materials and synthetic methods carried out by a skilled synthetic chemist.

Another essential feature of the infrared radiation-sensitive image-recording layer is one or more d) borate compounds represented by the following structure (I).

$$B^-(R^1)(R^2)(R^3)(R^4)Z^+ \qquad (I)$$

wherein $R^1$, $R^2$, $R^3$, and $R^4$ independently represent substituted or unsubstituted alkyl, aryl, alkenyl, alkynyl, cycloalkyl, or heterocyclic groups each attached to the boron atom, or two or more of $R^1$, $R^2$, $R^3$, and $R^4$ can be joined together to form a heterocyclic ring with the boron atom, such heterocyclic rings each having up to 7 carbon, nitrogen, oxygen, or sulfur atoms, and $Z^+$ is a cation to balance the electric charge of the borate anion.

For example, useful substituted or unsubstituted alkyl groups can comprise 1 to 10 carbon atoms; the substituted or unsubstituted aryl groups can have 6 or 10 carbon atoms in the carbocyclic ring; the substituted or unsubstituted alkenyl groups can have 2 to 10 carbon atoms; the substituted or unsubstituted alkynyl groups can have 2 to 10 carbon atoms; and the substituted or unsubstituted cycloalkyl groups can comprise 5 to 10 carbon atoms in the carbocyclic ring.

Useful borate compounds of this type include those having a borate anion such as one of those described in Cols. 7 and 8 of U.S. Pat. No. 7,524,614 (noted above) the disclosure of which is incorporated herein by reference, and those described in [0012] to [0044] of Japanese Patent Publication 2002/107916.

For example, tetraaryl borate compounds including tetraphenyl borate, and triarylalkyl borate such as triphenylalkyl borate compounds are useful.

The $Z^+$ in structure (I) can be part of the c) initiator composition such as iodonium cations and sulfonium cations or part of the b) infrared radiation absorbers such as a cyanine dye cations as described in United States Patent Application Publication 2011/003123 (Simpson et al.), the disclosure of which is incorporated herein by reference. More useful cations include, but are not limited to, any cation that is chemically possible and such cations would be readily apparent to one skilled in the art. For example, other suitable cations include alkali metal ions such as sodium and potassium ions, quaternary ammonium and phosphonium cations such as for example tetraalkyl ammonium cations, pyridinium, piperidinium, pyrrolidinium, pyrrolinium, imidazolium, pyrazolium, oxazolium, thiazolium, triazolium and other organic cations.

During or after imaging exposure of the infrared radiation-sensitive image-recording layer to infrared radiation, the one or more d) borate compounds are believed to decompose and produce one or more active boron-containing species that can participate in the formation of a colored boronic complex as described below. Examples of useful active boron-containing species include but are not limited to, boric acid, alky boronic acid, aryl boronic acid, dialkyl borinic acid, diaryl borinic acid, and alkyl aryl borinic acid, wherein each of the alkyl and aryl groups independently can be optionally substituted with substituents such as a halo group, methyl group, ester group, amide group, or hydroxy group. In general, the unreacted d) borate compound does not substantially form the colored boronic complex during normal storage of the lithographic printing plate precursors according to the present invention. As a result, the molar concentration of the colored boronic acid formed in the infrared radiation non-exposed region of the lithographic printing plate precursors is less than the molar concentration of the colored boronic complex formed in the infrared radiation exposed region after 30 minutes following the infrared radiation imaging exposure under ambient conditions, typically by less than 50% and more typically by less than 70%.

In addition to producing active boron-containing species for forming the colored boronic complex described below, the d) borate compound according to some embodiments of the present invention can produce free radicals alone or in combination with components in the c) initiator composition described above during imaging exposure to infrared radiation. Useful examples of the d) borate compound that can also produce free radicals include those described in Cols. 7 and 8 of U.S. Pat. No. 7,524,614 (noted above) and those described in [0012] to [0044] of Japanese Patent Publication 2002/107916. It is also possible for the d) borate compound and at least one onium salt to form a common salt compound.

In embodiments where the d) borate compound comprises a $Z^+$ counter ion that is an infrared radiation absorbing cation, the d) borate compound can also function as an infrared radiation absorber b).

The total amount of the d) one or more borate compounds represented by structure (I) in the infrared radiation-sensitive image-recording layer can be generally at least 0.5 weight %, or at least 1 weight %, and up to and including 10 weight % or up to and including 20 weight %, all based on the total dry coverage of the infrared radiation-sensitive image-recording layer.

In embodiments wherein the d) borate compound can also function as a free radical initiator, infrared radiation absorber, or both a radical initiator and infrared radiation absorber, a separate non-borate containing initiator composition c) and a separate non-borate containing infrared radiation absorber are no longer required, but can still be included if desired.

For the present invention, the molar ratio of the d) borate compound to the e) compound capable of forming a colored boronic complex (described below) is at least 0.05:1 and up to and including 20:1, or more likely at least 0.1:1 and up to and including 10:1.

Useful d) borate compounds can be obtained from various commercial sources or prepared using starting materials and synthetic methods known to one skilled in the art.

In addition, the one or more e) compounds, each capable of forming a colored boronic complex during or after exposure to infrared radiation, are present in the infrared radiation-sensitive image-recording layer. The colored boronic complex during or after exposure of the infrared radiation-sensitive image-recording layer to infrared radiation has at least one absorption peak in the visible spectral region. Such e) compound(s) can be a compound having substantially no absorption peak in the visible spectral region before forming the colored boronic complex or it can be a compound having at least one absorption peak in the visible spectral region but at a wavelength that is substantially different from the absorption peak of the colored boronic complex.

Some particularly useful compounds can be defined as compounds comprising one or more occurrences of the following substructures (II), (III), and (IV):

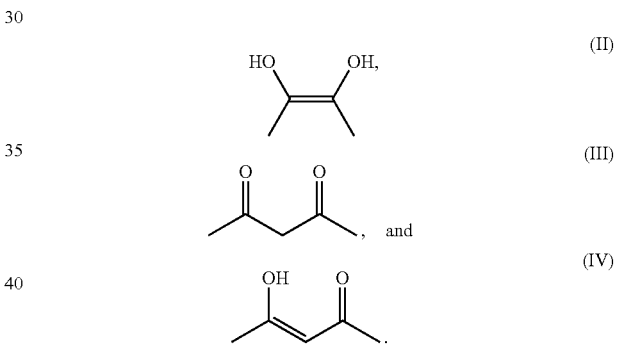

Such compounds can have one or more occurrences of one or more of substructures (II), (III), and (IV). It can be particularly desirable for the e) compound that is capable of forming a colored boronic complex during or after exposure of the infrared radiation-sensitive image-recording layer to infrared radiation to comprise one or more of occurrences of the substructure (III).

Useful e) compounds comprising one or more occurrences of substructure (II) include but are not limited to, Alizarin, Alizarin Red S, and pyrocatechol violet. Such compounds typically have one or more absorption peaks in the visible spectrum. Such visible absorption peaks can shift to a different wavelength upon formation of the colored boronic complex. The formed boronic complex can comprise one or one or more occurrences of one or more both of the following substructure (IIa) or substructure (IIb):

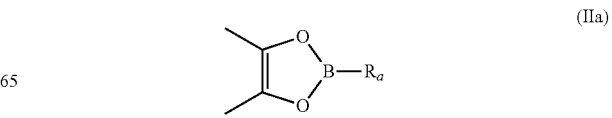

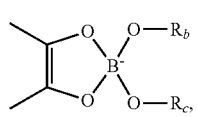

wherein $R_a$ can be one of $R^1$, $R^2$, $R^3$ and $R^4$ as defined above for structure (I) for the d) borate compound, or $R_a$ can be a —OH group; $R_b$ and $R_c$ can be a residue from the e) compound capable of forming a colored boronic complex; a hydrogen atom, a substituted or unsubstituted alkyl group, or a substituted or unsubstituted aryl group. For some embodiments, $R_b$ and $R_c$ can be a residue from the e) compound capable of forming a colored boronic complex and the colored boronic acid complex can comprise one or more occurrences of the following substructure (IIc):

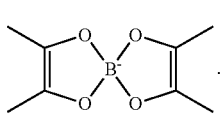

Useful e) compounds comprising one or more occurrences of the substructure (III) include those compounds represented by the following Structure (V):

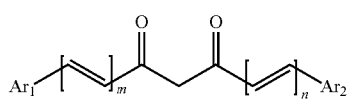

wherein $Ar_1$ and $Ar_2$ are independently a substituted or unsubstituted carbocyclic aromatic group or a substituted or unsubstituted heteroaromatic group; and m and n are independently 0, 1, 2, or 3. Such substituted or unsubstituted carbocyclic aromatic groups include but are not limited to, unsubstituted phenyl, unsubstituted naphthyl, or phenyl or naphthyl substituted with one or more of hydroxy, alkyl, halogen, alkoxy, alkylcarbonyl, alkylcarbonyloxy, alkoxycarbonyl, aryl, aryloxy, nitro, amino, alkylamino, dialkylamino, arylamino, diarylamino, or acetylamino groups. Such substituted or unsubstituted heteroaromatic groups include but are not limited to, unsubstituted pyridin-2-yl, pyridin-3-yl, pyridin-4-yl, pyrimidin-2-yl, pyrimidin-4-yl, pyrimidin-5-yl, or pyrimidin-6-yl, pyrazine, furan, thiophene, pyrrazole or oxazole, imidazole and thiazole groups, or such groups substituted as described for the carbocyclic aromatic groups.

More particularly, the e) compound capable of forming a colored boronic complex during or after exposure of the infrared radiation-sensitive image-recording layer to infrared radiation can be represented by the following Structure (VI):

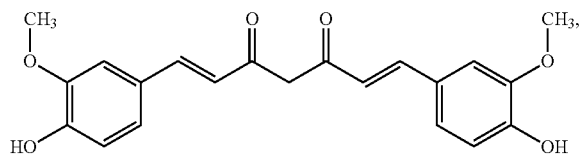

wherein $R_1$ and $R_2$ are independently a substituent selected from the group consisting of hydroxy, halogen, alkyl, alkoxy, alkylcarbonyl, alkylcarbonyloxy, alkoxycarbonyl, aryl, aryloxy, nitro, amino, alkylamino, dialkylamino, arylamino, diarylamino, and acetylamino groups, which substituent is positioned at any of the ortho, meta and para positions of the benzene ring to which it is attached; m and n are independently 0, 1, 2, or 3; and p and q are independently 0 to 5.

Representative compounds of this type include but are not limited to, the following compounds, which can be used individually or in any mixture thereof:

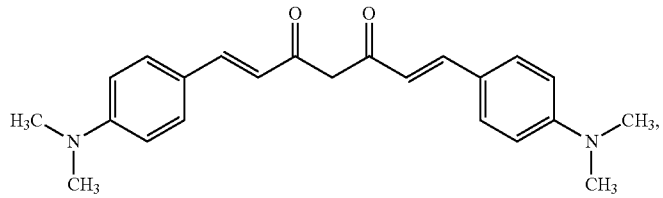

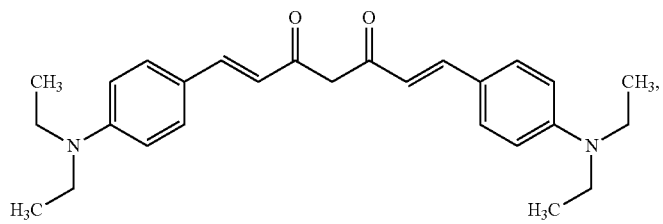

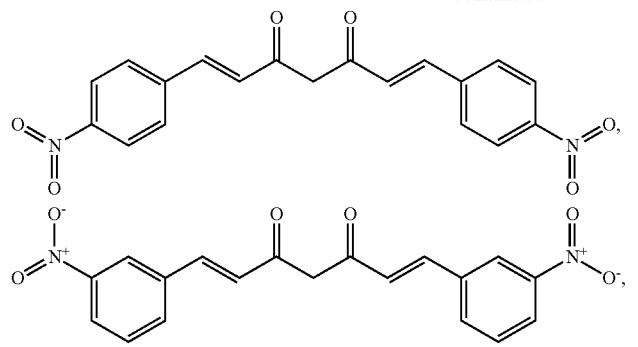
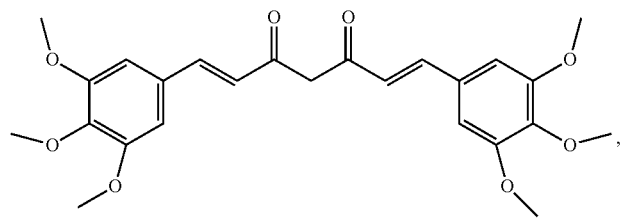
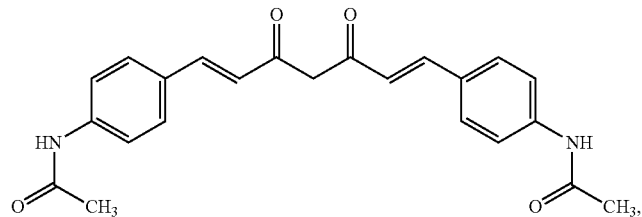
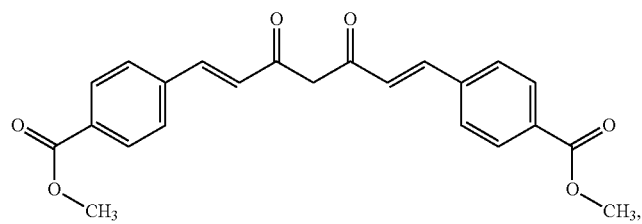
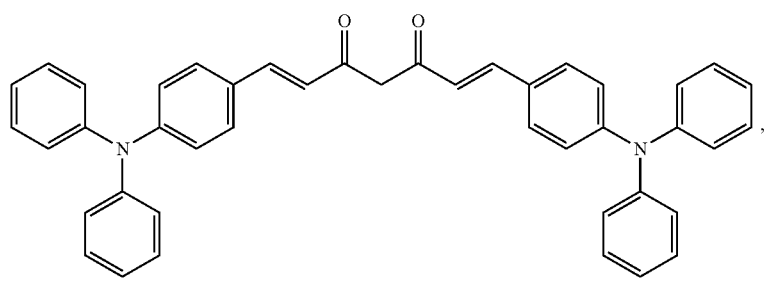
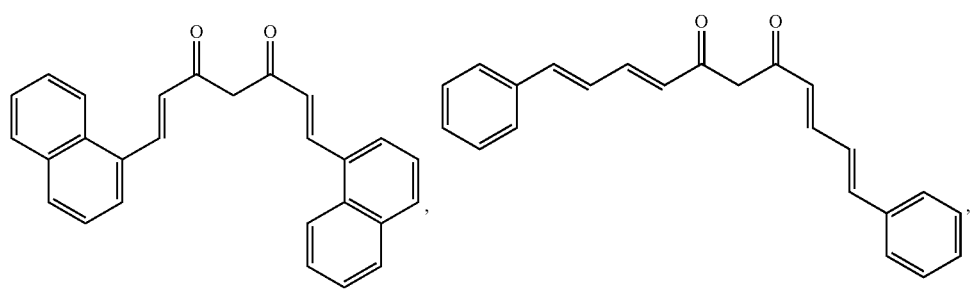

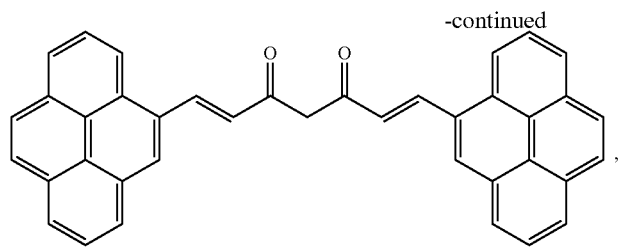

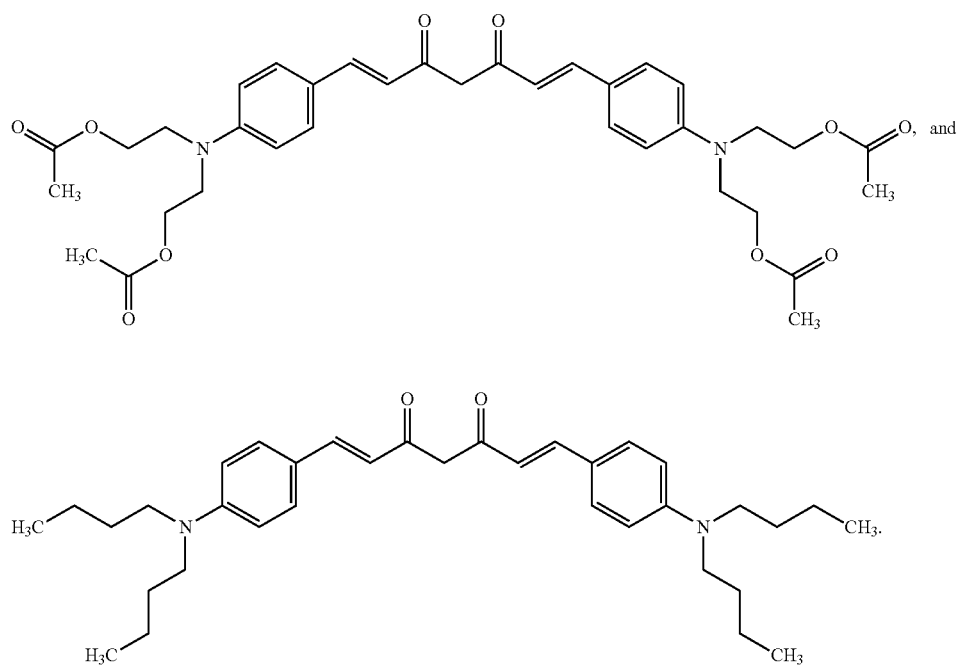

Useful colored boronic complexes derived from the e) compound capable of forming a colored boronic complex during or after infrared radiation exposure, and having the substructure (III) can comprise one or more occurrences of the following substructure (IIIa) or (IIIb):

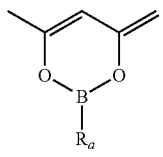
(IIIa)

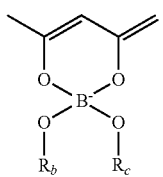
(IIIb)

wherein $R_a$ can be one of $R^1$, $R^2$, $R^3$ and $R^4$ as defined above for structure (I) for the d) borate compound or $R_a$ can be a —OH group; $R_b$ and $R_c$ can be a residue from the e) compound capable of forming a colored boronic complex, a hydrogen atom, substituted or unsubstituted alkyl group, or a substituted or unsubstituted aryl group. For some embodiments, $R_b$ and $R_c$ can be a residue from the e) compound capable of forming a colored boronic complex and the colored boronic acid complex can have one or more occurrences of the substructure (IIIc).

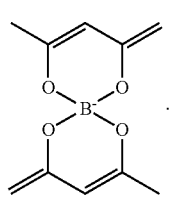
(IIIc)

Useful e) compounds having substructure (IV) include kermesic acid, Acilan Saphirol SE, Vat Violet 1, C.I. Disperse Red 60, carminic acid, alizarin, purpurinem quinalizarin, alizarin red, and similar hydroxy substituted derivatives of anthraquinone. Such compounds typically have one or more absorption peaks in the visible spectrum. Such visible absorption peaks can shift to a different wavelength upon formation of the colored boronic complex. The structure of the formed boronic complexes are similar to those formed by boronic compounds comprised of substructure (III) for example as defined by substructures (IIIa) to (IIIc).

Representative compounds of this type include but are not limited to:

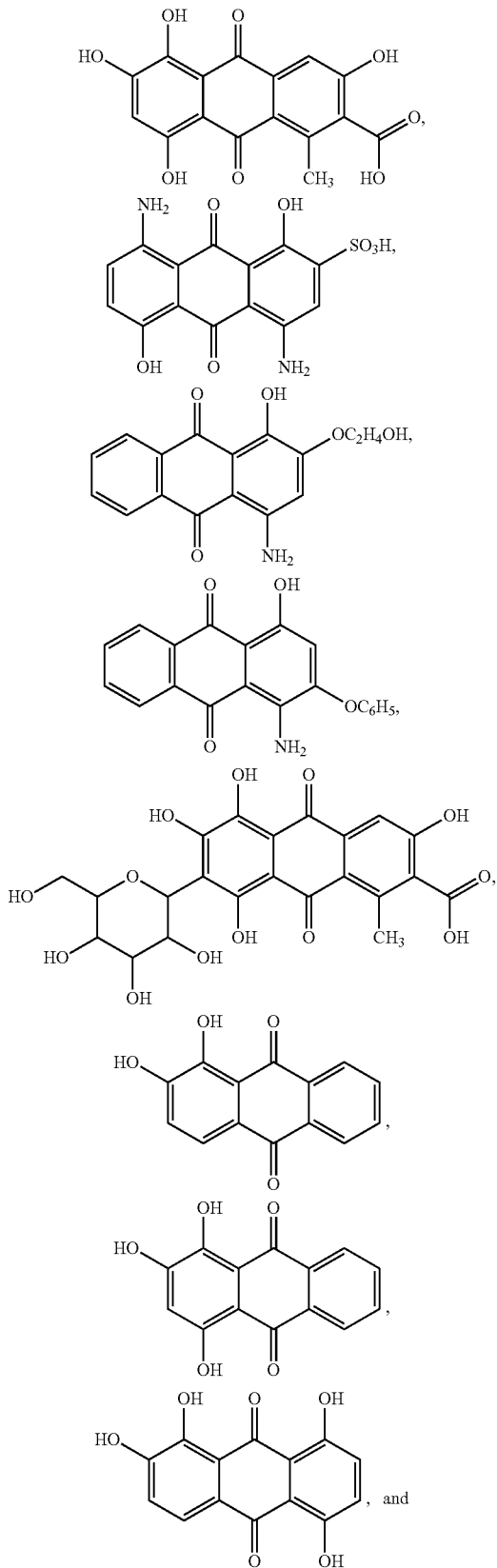

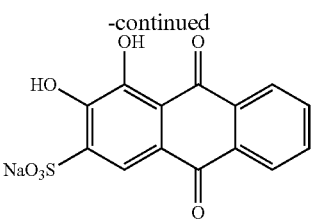

The one or more e) compounds, each capable of forming a colored boronic complex are present in the infrared radiation-sensitive image-recording layer in a dry coverage amount of at least 0.5 weight % and up to and including 20 weight %.

Such one or more e) compounds can be obtained from various commercial sources or prepared using starting materials and synthetic methods known to one skilled in the art.

It is optional but desirable in some embodiments that the infrared radiation-sensitive image-recording layer further comprises one or more f) non-free radically polymerizable polymeric materials (or polymeric binders) that does not have any functional groups that, if present, would make the polymeric material capable of free radical polymerization. Thus, such f) non-free radically polymerizable polymeric materials are different from the one or more a) free radically polymerizable components described above, and they are different materials from all of the b), c), d), and e) components described above.

Useful f) non-free radically polymerizable polymeric materials generally have a weight average molecular weight (Mw) of at least 2,000, or at least 20,000, and up to and including 300,000 or up to and including 500,000, as determined by Gel Permeation Chromatography (polystyrene standard).

Such f) non-free radically polymerizable polymeric materials can be selected from polymeric binder materials known in the art including polymers comprising recurring units having side chains comprising polyalkylene oxide segments such as those described in for example, U.S. Pat. No. 6,899,994 (Huang et al.) the disclosure of which is incorporated herein by reference. Other useful polymeric binders comprise two or more types of recurring units having different side chains comprising polyalkylene oxide segments as described in for example WO Publication 2015-156065 (Kamiya et al.). Some of such polymeric binders can further comprise recurring units having pendant cyano groups as those described in for example U.S. Pat. No. 7,261,998 (Hayashi et al.) the disclosure of which is incorporated herein by reference.

Such one or more f) polymeric non-free radically polymerizable materials also can have a backbone comprising multiple (at least two) urethane moieties as well as pendant groups comprising the polyalkylenes oxide segments.

Some useful f) non-free radically polymerizable polymeric materials, can be present in particulate form, that is, in the form of discrete particles (non-agglomerated particles). Such discrete particles can have an average particle size of at least 10 nm and up to and including 1500 nm, or typically of at least 80 nm and up to and including 600 nm, and that are generally distributed uniformly within the infrared radiation-sensitive image-recording layer. Some of these materials can be present in particulate form and have an average particle size of at least 50 nm and up to and including 400 nm. Average particle size can be determined using various known methods and nanoparticle measuring equipment, including measuring the particles in electron scanning microscope images and averaging a set number of measurements.

In some embodiments, the f) non-free radically polymerizable polymeric material can be present in the form of particles having an average particle size that is less than the average dry thickness (t) of the infrared radiation-sensitive image-recording layer. The average dry thickness (t) in micrometers (μm) is calculated by the following Equation:

$$t=w/r$$

wherein w is the dry coating coverage of the infrared radiation-sensitive image-recording layer in g/m² and r is 1 g/cm³.

The f) non-free radically polymerizable polymeric material(s) can be present in an amount of at least 10 weight %, or at least 20 weight %, and up to and including 50 weight %, or up to and including 70 weight %, based on the total dry coverage of the infrared radiation-sensitive image-recording layer.

Useful f) non-free radically polymerizable polymeric materials can be obtained from various commercial sources or they can be prepared using known procedures and starting materials, as described for example in publications described above and as known by skilled polymer chemists.

The infrared radiation-sensitive image-recording layer can optionally include crosslinked polymer particles, such materials having an average particle size of at least 2 μm, or of at least 4 μm, and up to and including 20 μm as described for example in U.S. Pat. No. 9,366,962 (Hayakawa et al.), U.S. Pat. No. 8,383,319 (Huang et al.) and U.S. Pat. No. 8,105,751 (Endo et al), the disclosures of all of which are incorporated herein by reference. Such crosslinked polymeric particles can be present only in the infrared radiation-sensitive image-recording layer, only in the hydrophilic protective layer when present (described below), or in both the infrared radiation-sensitive image-recording layer and the hydrophilic protective layer when present.

While the colored boronic complex formed in the infrared radiation exposed region can provide strong and long lasting printout to the lithographic printing plate precursors of the present invention, additional printout can be provided by combined use with traditional dye precursors that can be transformed into a uniquely colored form in the presence of acid or free radicals. Acid radicals and free radicals can be produced from the c) initiator composition, the d) the borate compound represented by structure (I), or both the c) initiator composition and the d) the borate compound. Useful dye precursors include those described in U.S. Ser. No. 16/572,731, the disclosure of which is incorporated herein by reference, and the various classes of color forming compounds described according to color forming mechanisms on pages 11 and 12 of United States Patent Application Publication 2018/154,667, the disclosure of which is incorporated herein by reference. These dye precursors typically form colored compounds instantly during imaging exposure to infrared radiation precursors. Printouts generated from such dye precursors typically fade over time as described in the background section, but are still desirable when the formation of the colored boronic complex according the present invention sometimes is not instantaneous and takes some time to achieve the full potential of its printout capability.

The infrared radiation-sensitive image-recording layer can also include a variety of other optional addenda including but not limited to, dispersing agents, humectants, biocides, plasticizers, surfactants for coatability or other properties, viscosity builders, pH adjusters, drying agents, defoamers, development aids, rheology modifiers, or combinations thereof, or any other addenda commonly used in the lithographic coating art, in conventional amounts. The infrared radiation-sensitive image-recording layer can also include a phosphate (meth)acrylate having a molecular weight generally greater than 250 as described in U.S. Pat. No. 7,429,445 (Munnelly et al.) the disclosure of which is incorporated herein by reference.

Moreover, the infrared radiation-sensitive image-recording layer can optionally comprise one or more suitable co-initiators, chain transfer agents, antioxidants, or stabilizers to prevent or moderate undesired radical reactions. Suitable antioxidants and inhibitors for this purpose are described, for example in [0144] to [0149] of EP 2,735,903B1 (Werner et al.) and in Cols. 7-9 of U.S. Pat. No. 7,189,494 (Munnelly et al.), the disclosure of which is incorporated herein by reference.

The useful dry coverage of the infrared radiation-sensitive image-recording layer is described below.

Hydrophilic Protective Layer:

While in some embodiments of the present invention, the infrared radiation-sensitive image-recording layer is the outermost layer with no layers disposed thereon, it is possible that the precursors according to this invention can be designed with a hydrophilic protective layer (also known in the art as a hydrophilic overcoat, oxygen-barrier layer, or topcoat) disposed directly on the single infrared radiation-sensitive image-recording layer (with no intermediate layers between these two layers).

When present, this hydrophilic protective layer is generally the outermost layer of the precursor and thus, when multiple precursors are stacked one on top of the other, the hydrophilic protective layer of one precursor can be in contact with the backside of the substrate of the precursor immediately above it, where no interleaving paper is present.

Such hydrophilic protective layers can comprise one or more film-forming water-soluble polymeric binders in an amount of at least 60 weight % and up to and including 100 weight %, based on the total dry weight of the hydrophilic protective layer. Such film-forming water-soluble (or hydrophilic) polymeric binders can include a modified or unmodified poly(vinyl alcohol) having a saponification degree of at least 30%, or a degree of at least 75%, or a degree of at least 90%, and a degree of up to and including 99.9%.

Further, one or more acid-modified poly(vinyl alcohol)s can be used as film-forming water-soluble (or hydrophilic) polymeric binders in the hydrophilic protective layer. For example, at least one poly(vinyl alcohol) can be modified with an acid group selected from the group consisting of carboxylic acid, sulfonic acid, sulfuric acid ester, phosphonic acid, and phosphoric acid ester groups. Examples of useful modified poly(vinyl alcohol) materials include but are not limited to, sulfonic acid-modified poly(vinyl alcohol), carboxylic acid-modified poly(vinyl alcohol), and quaternary ammonium salt-modified poly(vinyl alcohol), glycol-modified poly(vinyl alcohol), or combinations thereof.

The optional hydrophilic overcoat can also include crosslinked polymer particles having an average particle size of at least 2 μm and as noted above.

When present, the hydrophilic protective layer is provided as a hydrophilic protective layer formulation and dried to provide a dry coating coverage of at least 0.1 g/m² and up to but less than 4 g/m², or typically at a dry coating coverage of at least 0.15 g/m² and up to and including 2.5 g/m². In some embodiments, the dry coating coverage is as low as 0.1

$g/m^2$ and up to and including 1.5 $g/m^2$ or at least 0.1 $g/m^2$ and up to and including 0.9 $g/m^2$, such that the hydrophilic protective layer is relatively thin for easy removal during off-press development or on-press development.

The hydrophilic protective layer can optionally comprise organic wax particles dispersed, generally uniformly, within the one or more film-forming water-soluble (or hydrophilic) polymeric binders as described for example in U.S. Patent Application Publication 2013/0323643 (Balbinot et al.) the disclosure of which is incorporated herein by reference.

Preparing Lithographic Printing Plate Precursors:

The lithographic printing plate precursors according to the present invention can be provided in the following manner. An infrared radiation-sensitive image-recording layer formulation comprising essential components a), b), c), d), and e), and optional component f) and other optional addenda, described above, can be applied to a hydrophilic surface of a suitable aluminum-containing substrate, usually in the form of a continuous web, as described above, using any suitable equipment and procedure, such as spin coating, knife coating, gravure coating, die coating, slot coating, bar coating, wire rod coating, roller coating, or extrusion hopper coating. Such formulation can also be applied by spraying onto a suitable substrate. Typically, once the infrared radiation-sensitive image-recording layer formulation is applied at a suitable wet coverage, it is dried in a suitable manner known in the art to provide a desired dry coverage as noted below, thereby providing an infrared radiation-sensitive continuous web or an infrared radiation-sensitive continuous article.

As noted above, before the infrared radiation-sensitive image-recording layer formulation is applied, the substrate (that is, a continuous roll or web) can be electrochemically grained and anodized as described above to provide a suitable hydrophilic anodic (aluminum oxide) layer on the outer surface of the aluminum-containing support, and the anodized surface usually can be post-treated with a hydrophilic polymer solution as described above. The conditions and results of these operations are well known in the art as described above.

The manufacturing methods typically include mixing the various components needed for the infrared radiation-sensitive image-recording layer in a suitable organic solvent or mixtures thereof with or without water [such as methyl ethyl ketone (2-butanone), methanol, ethanol, 1-methoxy-2-propanol, 2-methoxypropanol, iso-propyl alcohol, acetone, γ-butyrolactone, n-propanol, tetrahydrofuran, and others readily known in the art, as well as mixtures thereof], applying the resulting infrared radiation-sensitive image-recording layer formulation to a continuous substrate web, and removing the solvent(s) by evaporation under suitable drying conditions.

After proper drying, the dry coverage of the infrared radiation-sensitive image-recording layer on the substrate can be at least 0.1 $g/m^2$, or at least 0.4 $g/m^2$, and up to and including 2 $g/m^2$ or up to and including 4 $g/m^2$ but other dry coverage amounts can be used if desired, to provide a desired dry coverage.

As described above, in some embodiments, a suitable aqueous-based hydrophilic protective layer formulation (described above) can be applied to the dried infrared radiation-sensitive image-recording layer using known coating and drying conditions, equipment, and procedures.

In practical manufacturing conditions, the result of these coating operations is a continuous radiation-sensitive web (or roll) of infrared radiation-sensitive lithographic printing plate precursor material having either only a single infrared radiation-sensitive image-recording layer or both a single infrared radiation-sensitive image-recording layer and a hydrophilic protective layer disposed as the outermost layer. Such continuous radiation-sensitive web can be slit or cut into appropriately sized precursors for use.

Imaging (Exposing) Conditions

During use, an infrared radiation-sensitive lithographic printing plate precursor of this invention can be exposed to a suitable source of infrared radiation depending upon the infrared radiation absorber(s) present in the infrared radiation-sensitive image-recording layer. In some embodiments, the lithographic printing plate precursors can be imaged with one or more lasers that emit significant infrared radiation within the range of at least 750 nm and up to and including 1400 nm, or of at least 800 nm and up to and including 1250 nm to create exposed regions and non-exposed regions in the infrared radiation-sensitive image-recording layer. Such infrared radiation-emitting lasers can be used for such imaging in response to digital information supplied by a computing device or other source of digital information. The laser imaging can be digitally controlled in a suitable manner known in the art.

Thus, imaging can be carried out using imaging or exposing infrared radiation from an infrared radiation-generating laser (or array of such lasers). Imaging also can be carried out using imaging radiation at multiple infrared (or near-IR) wavelengths at the same time if desired. The laser(s) used to expose the precursor is usually a diode laser(s), because of the reliability and low maintenance of diode laser systems, but other lasers such as gas or solid-state lasers can also be used. The combination of power, intensity and exposure time for infrared radiation imaging would be readily apparent to one skilled in the art.

The infrared imaging apparatus can be configured as a flatbed recorder or as a drum recorder, with the infrared radiation-sensitive lithographic printing plate precursor mounted to the interior or exterior cylindrical surface of the drum. An example of useful imaging apparatus is available as models of KODAK® Trendsetter platesetters (Eastman Kodak Company) and NEC AMZISetter X-series (NEC Corporation, Japan) that contain laser diodes that emit radiation at a wavelength of about 830 nm. Other suitable imaging apparatus includes the Screen PlateRite 4300 series or 8600 series platesetters (available from Screen USA, Chicago, Ill.) or thermal CTP platesetters from Panasonic Corporation (Japan) that operates at a wavelength of 810 nm.

It can be desirable to include a means for reducing or removing ozone in the environment of the laser imaging if the infrared radiation-sensitive image-recording layer is sensitive to the presence of ozone. Useful means and system for doing this is described for example in U.S. Patent Application Publication 2019/0022995 (Igarashi et al.), the disclosure of which is incorporated herein by reference.

When an infrared radiation imaging source is used, imaging intensities can be at least 30 $mJ/cm^2$ and up to and including 500 $mJ/cm^2$ and typically at least 50 $mJ/cm^2$ and up to and including 300 $mJ/cm^2$ depending upon the sensitivity of the infrared radiation-sensitive image-recording layer.

Processing (Development) and Printing

After imagewise exposing as described above, the exposed infrared radiation-sensitive lithographic printing plate precursors having exposed regions and non-exposed regions in the infrared radiation-sensitive image-recording layer can be processed off-press or on-press to remove the non-exposed regions (and any hydrophilic protective layer over such regions). After this processing, and during lithographic printing, the revealed hydrophilic substrate surface repels inks while the remaining exposed regions accept lithographic printing ink.

Off-Press Development and Printing:

Processing can be carried out off-press using any suitable developer in one or more successive applications (treatments or developing steps) of the same or different processing solution (developer). Such one or more successive processing treatments can be carried out for a time sufficient to remove the non-exposed regions of the infrared radiation-sensitive image-recording layer to reveal the outermost hydrophilic surface of the substrate, but not long enough to remove significant amounts of the exposed regions that have been hardened in the same layer.

Prior to such off-press processing, the exposed precursors can be subjected to a "pre-heating" process to further harden the exposed regions in the infrared radiation-sensitive image-recording layer. Such optional pre-heating can be carried out using any known process and equipment generally at a temperature of at least 60° C. and up to and including 180° C.

Following this optional pre-heating, or in place of the pre-heating, the exposed precursor can be washed (rinsed) to remove any hydrophilic overcoat that is present. Such optional washing (or rinsing) can be carried out using any suitable aqueous solution (such as water or an aqueous solution of a surfactant) at a suitable temperature and for a suitable time that would be readily apparent to one skilled in the art.

Useful developers can be ordinary water or formulated aqueous solutions. The formulated developers can comprise one or more components selected from surfactants, organic solvents, alkali agents, and surface protective agents. For example, useful organic solvents include the reaction products of phenol with ethylene oxide and propylene oxide [such as ethylene glycol phenyl ether (phenoxyethanol)], benzyl alcohol, esters of ethylene glycol and of propylene glycol with acids having 6 or less carbon atoms, and ethers of ethylene glycol, diethylene glycol, and of propylene glycol with alkyl groups having 6 or less carbon atoms, such as 2-ethylethanol and 2-butoxyethanol.

In some instances, an aqueous processing solution can be used off-press to both develop the imaged precursor by removing the non-exposed regions and also to provide a protective layer or coating over the entire imaged and developed (processed) precursor printing surface. In this embodiment the aqueous solution behaves somewhat like a gum that is capable of protecting (or "gumming") the lithographic image on the lithographic printing plate against contamination or damage (for example, from oxidation, fingerprints, dust, or scratches).

After the described off-press processing and optional drying, the resulting lithographic printing plate can be mounted onto a printing press without any contact with additional solutions or liquids. It is optional to further bake the lithographic printing plate with or without blanket or flood-wise exposure to UV or visible radiation.

Printing can be carried out by applying a lithographic printing ink and fountain solution to the printing surface of the lithographic printing plate in a suitable manner. The fountain solution is taken up by the hydrophilic surface of the substrate revealed by the exposing and processing steps, and the lithographic ink is taken up by the remaining (exposed) regions of the infrared radiation-sensitive image-recording layer. The lithographic ink is then transferred to a suitable receiving material (such as cloth, paper, metal, glass, or plastic) to provide a desired impression of the image thereon. If desired, an intermediate "blanket" roller can be used to transfer the lithographic ink from the lithographic printing plate to the receiving material (for example, sheets of paper).

On-Press Development and Printing:

Alternatively, the negative-working lithographic printing plate precursors of the present invention are on-press developable using a lithographic printing ink, a fountain solution, or a combination of a lithographic printing ink and a fountain solution. In such embodiments, an imaged (exposed) infrared radiation-sensitive lithographic printing plate precursor according to the present invention is mounted onto a printing press and the printing operation is begun. The non-exposed regions in the infrared radiation-sensitive image-recording layer are removed by a suitable fountain solution, lithographic printing ink, or a combination of both, when the initial printed impressions are made. Typical ingredients of aqueous fountain solutions include pH buffers, desensitizing agents, surfactants and wetting agents, humectants, low boiling solvents, biocides, anti-foaming agents, and sequestering agents. A representative example of a fountain solution is Varn Litho Etch 142W+ Varn PAR (alcohol sub) (available from Varn International, Addison, Ill.).

In a typical printing press startup with a sheet-fed printing machine, the dampening roller is engaged first and supplies fountain solution to the mounted imaged precursor to swell the exposed infrared radiation-sensitive image-recording layer at least in the non-exposed regions. After a few revolutions the inking rollers are engaged and they supply lithographic printing ink(s) to cover the entire printing surface of the lithographic printing plates. Typically, within 5 to 20 revolutions after the inking roller engagement, printing sheets are supplied to remove the non-exposed regions of the infrared radiation-sensitive image-recording layer from the lithographic printing plate as well as materials on a blanket cylinder if present, using the formed ink-fountain solution emulsion.

On-press developability of infrared radiation exposed lithographic printing precursors is particularly useful when the precursor comprises one or more polymeric binder materials (whether free radically polymerizable or not) in an infrared radiation-sensitive image-recording layer, at least one of which polymeric binders is present as particles having an average diameter of at least 50 nm and up to and including 400 nm.

The present invention provides at least the following embodiments and combinations thereof, but other combinations of features are considered to be within the present invention as a skilled artisan would appreciate from the teaching of this disclosure:

1. A lithographic printing plate precursor comprising a substrate, and an infrared radiation-sensitive image-recording layer disposed on the substrate, the infrared radiation-sensitive image-recording layer comprising:

a) a free radically polymerizable component;

b) an infrared radiation absorber;

c) an initiator composition capable of generating free radicals;

d) a borate compound; and e) a compound capable of forming a colored boronic complex during or after exposure of the infrared radiation-sensitive image-recording layer to infrared radiation, where the borate compound is represented by the following structure (I)

$$B^-(R^1)(R^2)(R^3)(R^4)Z^+ \qquad (I)$$

wherein R¹, R², R³, and R⁴ independently represent optionally substituted alkyl, aryl, alkenyl, alkynyl, cycloalkyl, or heterocyclic groups attached to the boron atom of the borate anion, or two or more of R¹, R², R³, and R⁴ can be joined together to form a heterocyclic ring with the boron atom, such heterocyclic ring having up to 7 carbon, nitrogen, oxygen, or sulfur atoms; and $Z^+$ is a cation to balance the electric charge of the borate anion.

2. The lithographic printing plate precursor of embodiment 1, wherein the e) compound capable of forming a colored boronic complex comprises one or more occurrences of one or more of the following substructures (II), (III), and (IV):

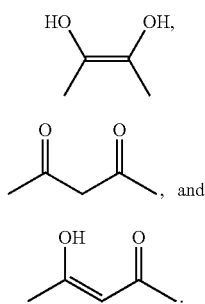

3. The lithographic printing plate precursor of embodiment 1 or 2, wherein the infrared radiation-sensitive image-recording layer further comprises one or more f) non-free radically polymerizable polymeric materials that are different from the a), b), c), d), and e) components defined above.

4. The lithographic printing plate precursor of embodiment 3, wherein the one or more f) non-free radically polymerizable polymeric materials are present in particulate form.

5. The lithographic printing plate precursor of any of embodiments 1 to 4, wherein the c) initiator composition comprises at least one onium salt that is capable of generating free radicals.

6. The lithographic printing plate precursor of embodiment 5, wherein the onium salt is a diaryliodonium salt.

7. The lithographic printing plate precursor of embodiment 5 or 6, wherein the d) borate compound and the at least one onium salt are used as a common salt compound.

8. The lithographic printing plate precursor of any of embodiments 1 to 7, wherein, after infrared radiation exposure, the infrared radiation sensitive image-recording layer is developable on-press using a lithographic ink, a fountain solution, or a combination of a lithographic ink and a fountain solution.

9. The lithographic printing plate precursor of any of embodiments 1 to 8, wherein the d) borate compound is present in the infrared radiation-sensitive image-recording layer in a dry coverage amount of at least 0.5 weight % and up to and including 20 weight %, based on the total dry coverage of the infrared radiation-sensitive image-recording layer.

10. The lithographic printing plate precursor of any of embodiments 1 to 9, wherein the e) compound capable of forming a colored boronic complex is present in the infrared radiation-sensitive image-recording layer in a dry coverage amount of at least 0.5 weight % and up to and including 20 weight %.

11. The lithographic printing plate precursor of any of embodiments 1 to 10, wherein the molar ratio of the d) borate compound to the e) compound capable of forming a colored boronic complex is at least 0.05:1 and up to and including 20:1.

12. The lithographic printing plate precursor of any of embodiments 1 to 11, wherein the infrared radiation-sensitive image-recording layer is the outermost layer.

13. The lithographic printing plate precursor of any of embodiments 1 to 12, wherein the infrared radiation-sensitive image-recording layer comprises at least two a) free radically polymerizable components.

14. The lithographic printing plate precursor of any of embodiments 1 to 13, wherein the substrate comprises an aluminum-containing substrate comprising an aluminum oxide layer, and a hydrophilic polymer coating that is disposed on the aluminum oxide layer.

15. The lithographic printing plate precursor of any of embodiments 2 to 14, wherein the e) compound capable of forming a colored boronic complex comprises one or more occurrences of the substructure (III).

16. The lithographic printing plate precursor of embodiment 15, wherein the e) compound capable of forming a colored boronic complex is represented by the following Structure (V):

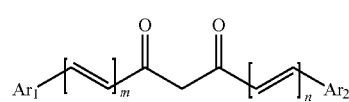

wherein $Ar_1$ and $Ar_2$ are independently a substituted or unsubstituted carbocyclic aromatic group or a substituted or unsubstituted heteroaromatic group; and m and n are independently 0, 1, 2, or 3.

17. The lithographic printing plate precursor of embodiment 15 or 16, wherein the e) compound capable of forming a colored boronic complex is represented by the following Structure (VI):

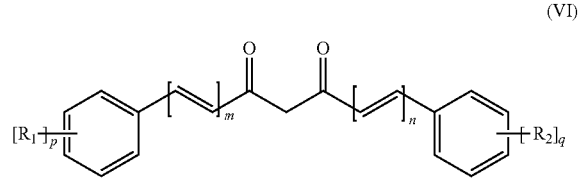

wherein $R_1$ and $R_2$ are independently a substituent selected from the group consisting of hydroxy, halogen, alkyl, alkoxy, alkylcarbonyl, alkylcarbonyloxy, alkoxycarbonyl, aryl, aryloxy, nitro, amino, alkylamino, dialkylamino, arylamino, diarylamino, and acetylamino groups, which substituent is positioned at any of the ortho, meta and para positions of the benzene ring to which it is attached; m and n are independently 0, 1, 2, or 3; and p and q are independently 0 to 5.

18. The lithographic printing plate precursor of any of embodiments 15 to 17, wherein the e) compound capable of forming a colored boronic complex comprises one or more of the following compounds:

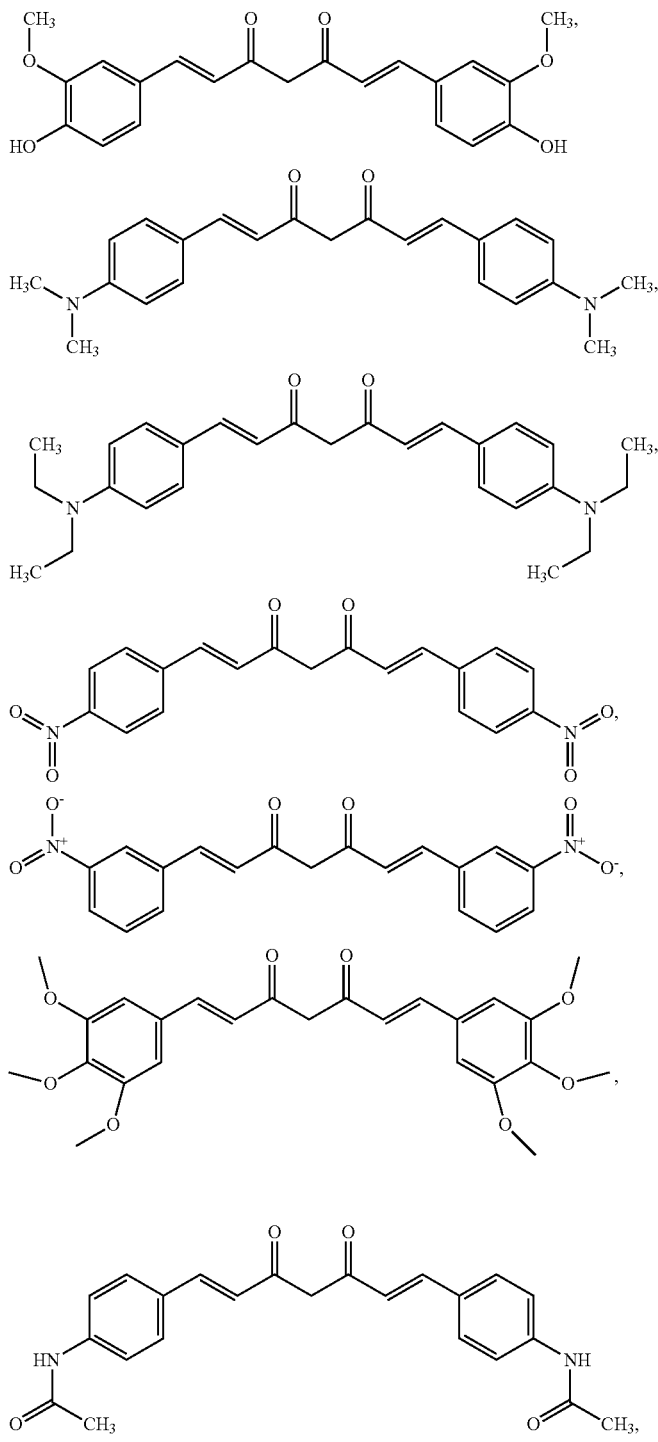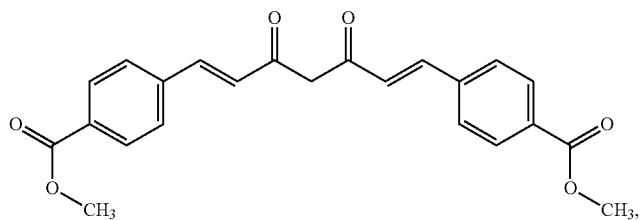

-continued

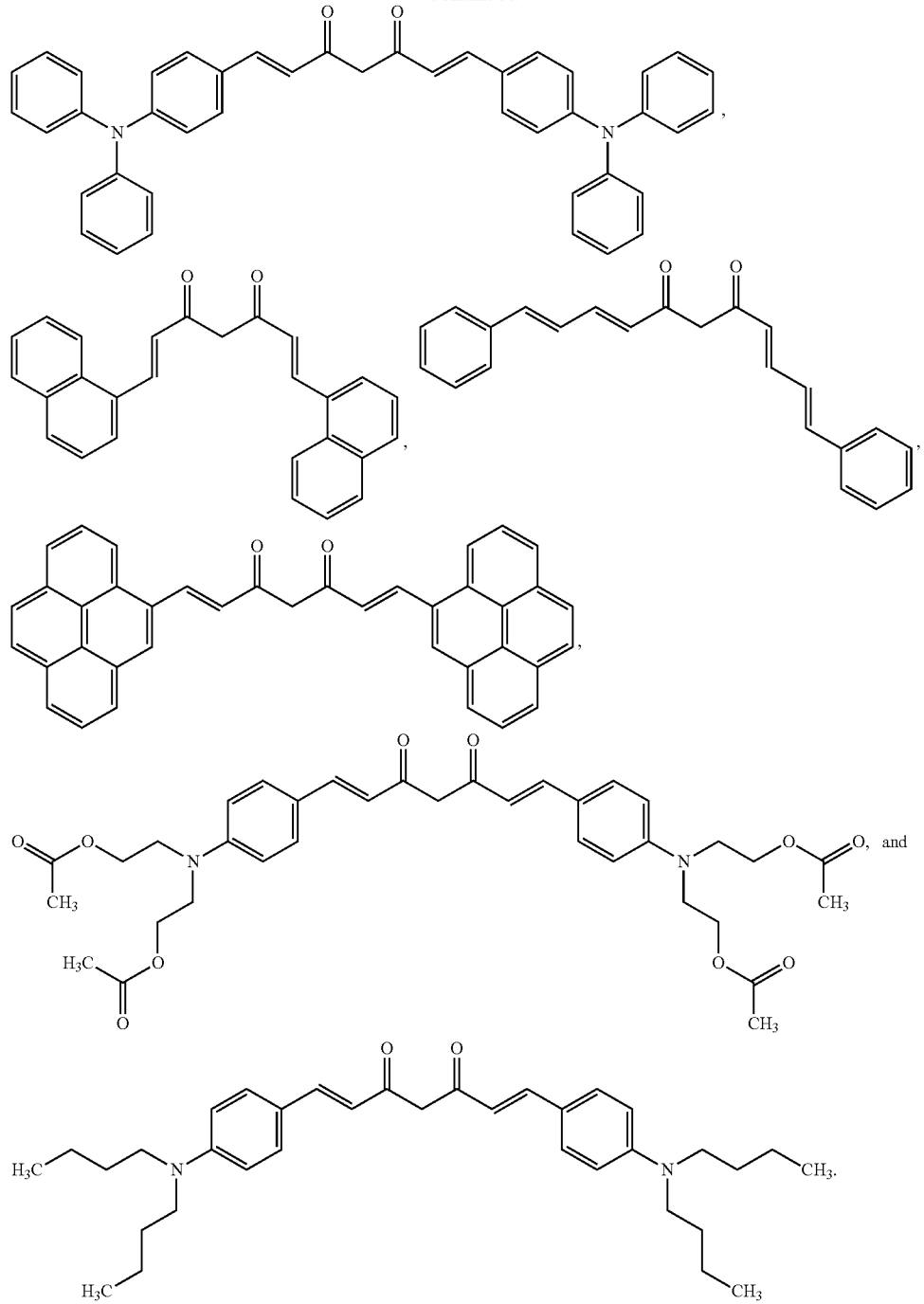

19. The lithographic printing plate precursor of any of embodiments 1 to 18, wherein the infrared radiation-sensitive image-recording layer further comprises one or more acid-sensitive dye precursors.

20. The lithographic printing plate precursor of any of embodiments 1 to 19, wherein the d) borate compound is a tetraaryl borate or a triarylalkyl borate.

21. A method for providing a lithographic printing plate, comprising:

A) imagewise exposing the lithographic printing plate precursor according to any of embodiments 1 to 20 to infrared radiation, to provide exposed regions and non-exposed regions in the infrared radiation-sensitive image-recording layer, and B) removing the non-exposed regions in the infrared radiation-sensitive image-recording layer from the substrate.

22. The method of embodiment 21, comprising removing the non-exposed regions in the infrared radiation-sensitive image-recording layer from the substrate on-press using a lithographic printing ink, a fountain solution, or a combination of a lithographic printing ink and a fountain solution.

The following examples are provided to further illustrate the practice of the present invention and are not meant to be limiting in any manner. Unless otherwise indicated, the materials used in the examples were obtained from various commercial sources as indicated but other commercial sources may be available.

Inventive and Comparative Examples

An aluminum-containing substrate was prepared for the lithographic printing plate precursors in the following manner:

A surface of an aluminum alloy sheet (support) was subjected to an electrolytic roughening treatment using hydrochloric acid to provide an average roughness Ra of 0.5 µm. The resulting grained aluminum sheet was subjected to an anodizing treatment using an aqueous phosphoric acid solution to form an aluminum oxide layer of 2.5 g/m² dry coverage, followed by a post-treatment application of a poly(acrylic acid) solution, to provide an aluminum-containing substrate.

A negative-working, infrared radiation-sensitive image-recording layer was then formed on the aluminum-containing substrate by individually coating an infrared radiation-sensitive composition formulation having the components shown in the following TABLE I using a bar coater, to provide a dry coating weight of 0.9 g/m² after drying at 50° C. for 60 seconds for each of the inventive and comparative precursors described below. The raw materials noted in TABLE I are identified in the following TABLE II. These materials can be obtained from one or more commercial sources of chemicals or prepared using known synthetic methods.

TABLE I

| Component | Amount (grams) |
|---|---|
| Polymer dispersion | 0.641 |
| Hydroxypropyl methyl cellulose | 0.400 |
| Monomer 1 | 0.333 |
| Monomer 2 | 0.167 |
| IR dye 1 | 0.020 |
| Leuco Dye 1 | Amount shown in TABLE III |
| Surfactant 1 | 0.045 |
| Boron-containing compound or iodonium salt (identified in TABLE II) | 0.05 |
| Compound capable of forming colored boronic complex (or also identified as "e) compound" in TABLE III below) | Compound and amount shown in TABLES II & III |
| 1-Propanol | 3.33 |
| 2-Butanone | 2.55 |
| 1-Methoxy-2-propanol | 0.92 |
| δ-Butyrolactone | 0.09 |
| Water | 1.4 |

TABLE II

| | |
|---|---|
| Polymer dispersion | The polymer dispersion was prepared according to Example 10 of EP 1,765,593, used as 23.5 weight % polymer in n-propanol/water at 80:20 weight ratio |
| Hydroxypropyl methyl cellulose | 5 weight % hydroxypropyl methyl cellulose polymer in water; the polymer is 30% methoxylated, 10% hydroxyl propoxylated and had a viscosity of 5 mPa-sec in a 2 weight % aqueous solution at 20° C. |
| Monomer 1 | Urethane acrylate prepared by reacting DESMODUR ® N100 (from Bayer Corp., Milford, CT) with hydroxyethyl acrylate and pentaerythritol triacrylate at approximately 1:1.5:1.5 molar ratio (40 weight % in 2-butanone). |
| Monomer 2 | Ethoxylated (10 EO) Bisphenol A acrylate, 40 weight % in 2-butanone |
| IR dye 1 | 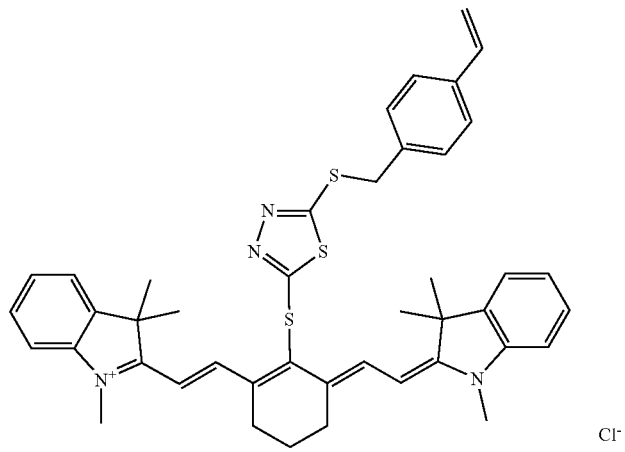 [SMILES: C=Cc1ccc(CSc2nnc(SC3=C(/C=C/C4=[N+](C)c5ccccc5C4(C)C)CCC/C3=C\C=C3\N(C)c4ccccc4C3(C)C)s2)cc1 ; [Cl-]] |
| Leuco dye 1 | 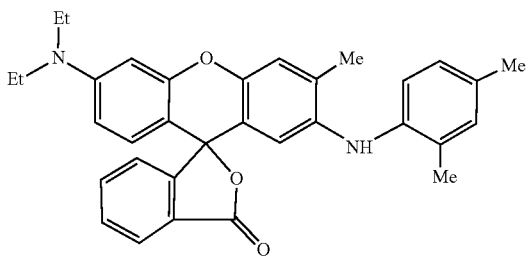 [SMILES: CCN(CC)c1ccc2c(c1)Oc1cc(C)c(Nc3ccc(C)cc3C)cc1C21OC(=O)c2ccccc21] |

TABLE II-continued
| | |
|---|---|
| Surfactant 1 | BYK ® 302 from Byk Chemie, used as a 25 weight % solution in 1-methoxy-2-propanol |
| Borate compound 1 | 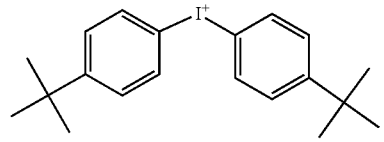 [SMILES: CC(C)(C)c1ccc([I+]c2ccc(C(C)(C)C)cc2)cc1] |
| Borate compound 2 | 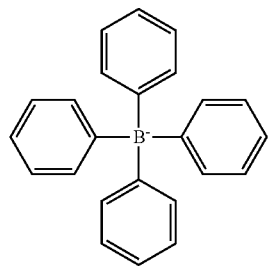 [SMILES: c1ccc([B-](c2ccccc2)(c2ccccc2)c2ccccc2)cc1] |
| Borate compound 3 | 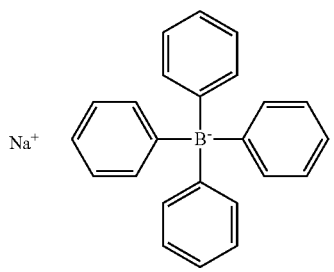 [SMILES: [Na+] ; c1ccc([B-](c2ccccc2)(c2ccccc2)c2ccccc2)cc1]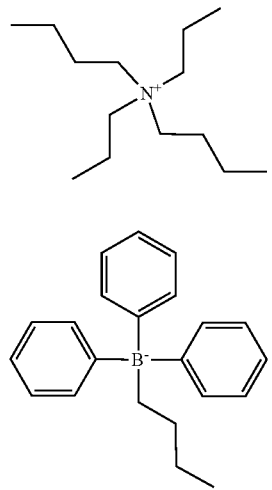 |

TABLE II-continued
| | |
|---|---|
| Borate compound 4 | 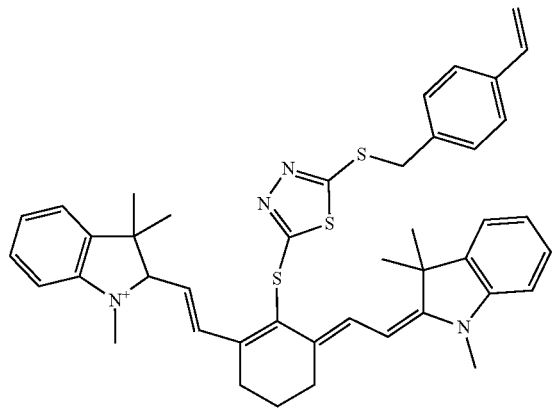 [SMILES: C=Cc1ccc(CSc2nnc(SC3=C(/C=C/C4[NH+](C)c5ccccc5C4(C)C)CCC/C3=C\C=C3\N(C)c4ccccc4C3(C)C)s2)cc1] |
| PB1 | 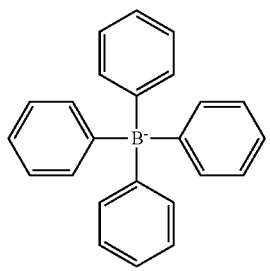 [SMILES: c1ccc([B-](c2ccccc2)(c2ccccc2)c2ccccc2)cc1] |
| Iodonium salt 1 | 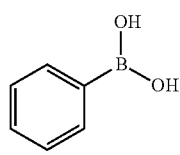 |
| Compound capable of forming colored boronic complex 1 | 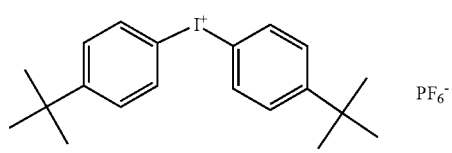 |
| Compound capable of forming colored boronic complex 2 | 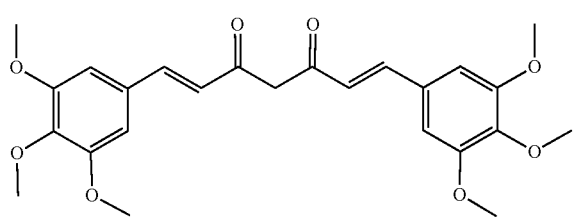 |

TABLE II-continued

| Compound capable of forming colored boronic complex 3 | 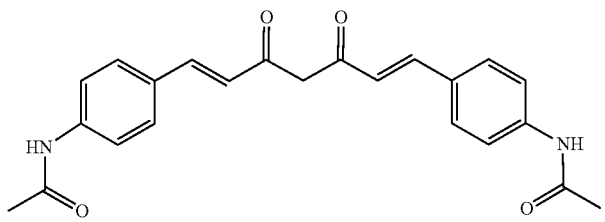 [SMILES: CC(=O)Nc1ccc(/C=C/C(=O)CC(=O)/C=C/c2ccc(NC(C)=O)cc2)cc1] |
|---|---|

The following TABLE III shows the e) compounds capable of forming a colored boronic complex upon exposure to infrared radiation, their amounts, the amount of leuco dye 1, and the borate compounds used in the various inventive and comparative working examples of negative-working lithographic printing plate precursors.

background and was given one of the following qualitative values based on the number of printed paper sheets to achieve a clean background.

+ <30 printing paper sheets
0 30-100 printed paper sheets
− >100 printed paper sheets

TABLE III

| Example | The e) Compound capable of forming colored boronic complex Type | Amount (g) | Leuco Dye Type | Amount (g) | Boron-containing Compound or iodonium salt |
|---|---|---|---|---|---|
| Inventive 1 | Curcumin | 0.025 | Leuco Dye 1 | 0.023 | Borate compound 1 |
| Inventive 2 | Curcumin | 0.023 | | 0 | Borate compound 1 |
| Inventive 3 | Pyrocatechol violet | 0.025 | Leuco Dye 1 | 0.023 | Borate compound 1 |
| Inventive 4 | Pyrocatechol violet | 0.023 | | 0 | Borate compound 1 |
| Inventive 5 | Curcumin | 0.023 | | 0 | Borate compound 2 |
| Inventive 6 | Curcumin | 0.023 | | 0 | Borate compound 3 |
| Inventive 7 | Curcumin | 0.023 | | 0 | Borate compound 4 (IR Dye 1 omitted) |
| Inventive 8 | Compound capable of forming colored boronic complex 1 | 0.023 | | 0 | Borate compound 1 |
| Inventive 9 | Compound capable of forming colored boronic complex 2 | 0.023 | | 0 | Borate compound 1 |
| Inventive 10 | Compound capable of forming colored boronic complex 3 | 0.023 | | 0 | Borate compound 1 |
| Comparative 1 | None | | WinCon Red | 0.023 | Borate compound 1 |
| Comparative 2 | None | | Leuco Dye 1 | 0.023 | Borate compound 1 |
| Comparative 3 | None | 0 | | 0 | Borate compound 1 |
| Comparative 4 | Curcumin | 0.023 | | 0 | Iodonium salt 1, Borate compound omitted |
| Comparative 5 | None | 0 | Leuco dye 1 | 0.023 | Borate compound 2 |
| Comparative 6 | Curcumin | 0.023 | | 0 | PB1, borate compound omitted |

WinCon Red can be obtained from Connect Chemicals.
Curcumin and pyrocatechol violet were purchased from Sigma Aldrich.

Each of the inventive and comparative lithographic printing plate precursors were evaluated using two tests: "on-press developability" (DOP) and "print-out image" (PO).

On-Press Developability:

On-press developability was evaluated by imagewise exposing each lithographic printing plate precursor at 120 mJ/cm² using a Trendsetter 800 III Quantum TH 1.7 (available from Eastman Kodak Company). Each imagewise exposed lithographic printing plate precursor was then mounted onto a MAN Roland Favorite 04 press machine without developing (processing). Fountain solution (Varn Supreme 6038) and lithographic printing ink (Gans Cyan) were supplied, and lithographic printing was performed. On-press development occurred during printing. Acceptable on-press developability was evaluated by counting the number of printed paper sheets needed to receive a clean Print-Out Image:

Each of the lithographic printing plate precursors was imagewise exposed using a Trendsetter 800 III Quantum TH 1.7 (available from Eastman Kodak Company) at 150 mJ/cm² to provide exposed regions and non-exposed regions in the negative-working, IR-sensitive imageable layer. For each imagewise exposed lithographic printing plate precursor, the color difference between exposed regions and non-exposed regions was measured by determining the ΔE value, using a Techkon Spectro Dens spectral densitometer, calculating the Euclidean distance of the measured L*a*b values, and given the following qualitative values immediately after exposure and 1 h after exposure (storage in the dark).

Initial Contrast
+ ΔE>12
0 ΔE=7-12
− ΔE<7

Contrast after Storage
++ increase by more than 10% of initial delta E
+ increase by more than 2% of initial delta E
0 +/−2% of initial delta E
− decrease by more than 2%
− − decrease by more than 10%

TABLE IV

| Example | Initial Print-out Image | Print-out after storage | On-Press Developability |
|---|---|---|---|
| Inventive 1 | + | + | + |
| Inventive 2 | + | ++ | + |
| Inventive 3 | 0 | ++ | 0 |
| Inventive 4 | 0 | ++ | − |
| Inventive 5 | + | 0 | + |
| Inventive 6 | − | ++ | + |
| Inventive 7 | 0 | ++ | + |
| Inventive 8 | + | ++ | + |
| Inventive 9 | + | ++ | + |
| Inventive 10 | + | ++ | + |
| Comparative 1 | 0 | − − | + |
| Comparative 2 | 0 | − | + |
| Comparative 3 | 0 | − | + |
| Comparative 4 | − | − | + |
| Comparative 5 | − | 0 | + |
| Comparative 6 | − | − − | + |

As can be seen from the data presented in TABLE IV, practice of the present invention provides lithographic printing plates having a print-out image on the same level as currently known methods (for example, see Inventive Example 7 vs. Comparative Example 3). The generation of print-out image using the present invention proceeds via a parallel mechanism and is therefore applicable in addition to the currently known methods, thus generating a print-out image improvement if used in addition to the already known methods (for examples, Inventive Example 1 vs. Comparative Example 2).

Inventive Examples 5 and 6 demonstrate that a print-out image can be formed using a variety of boronic compounds. From the data obtained in Inventive Example 7, it is concluded that no iodonium compound is needed for the print-out image formation of colored boronic complexes. The data from Inventive Examples 8, 9, and 10 demonstrate that the color forming effect is not significantly influenced by the substitution of the color-forming phenyl rings. The data from Comparative Example 4 demonstrate that a combination of curcumin derivative and borate compound is necessary for successful print-out image formation, as the absence of the borate compound according to structure (I) resulted in low printout even in the presence of curcumin. From the data in Comparative Example 6, it can be seen that the d) borate compound according to structure (I) is necessary to create the reactive boronic compounds, as the addition of phenylboronic acid which is outside the scope of structure (I), leads to an initially very colorful lithographic printing plate precursor which does not allow differentiation of infrared radiation exposed regions and non-exposed regions.

The invention has been described in detail with particular reference to certain preferred embodiments thereof, but it will be understood that variations and modifications can be effected within the spirit and scope of the invention.

The invention claimed is:

1. A lithographic printing plate precursor comprising a substrate, and an infrared radiation-sensitive image-recording layer disposed on the substrate, the infrared radiation-sensitive image-recording layer comprising:

a) a free radically polymerizable component;
b) an infrared radiation absorber;
c) an initiator composition capable of generating free radicals;
d) a borate compound; and
e) a compound capable of forming a colored boronic complex during or after exposure of the infrared radiation-sensitive image-recording layer to infrared radiation,
where the borate compound is represented by the following structure (I)

wherein $R^1$, $R^2$, $R^3$ and $R^4$ independently represent optionally substituted alkyl, aryl, alkenyl, alkynyl, cycloalkyl, or heterocyclic groups attached to the boron atom of the borate anion, or two or more of $R^1$, $R^2$, $R^3$ and $R^4$ can be joined together to form a heterocyclic ring with the boron atom, such heterocyclic ring having up to 7 carbon, nitrogen, oxygen, or sulfur atoms; and $Z^+$ is a cation to balance the electric charge of the borate anion; and wherein the e) compound capable of forming a colored boronic complex is represented by the following Structure (V):

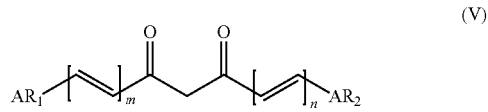

wherein $Ar_1$ and $Ar_2$ are independently a substituted or unsubstituted carbocyclic aromatic group or a substituted or unsubstituted heteroaromatic group; and m and n are independently 0, 1, 2, or 3 wherein the d) borate compound is present in the infrared radiation-sensitive image-recording layer in a dry coverage amount of at least 0.5 weight % and up to and including 20 weight % based on the total dry coverage of the infrared radiation-sensitive image-recording layer;

wherein the e) compound capable of forming a colored boronic complex is present in the infrared radiation-sensitive image-recording layer in a dry coverage amount of at least 0.5 weight % and up to and including 20 weight %;

and wherein the molar ratio of the d) borate compound to the e) compound capable of forming a colored boronic complex is at least 0.05:1 and up to and including 20:1.

2. The lithographic printing plate precursor of claim 1, wherein the infrared radiation-sensitive image-recording layer further comprises one or more f) non-free radically polymerizable polymeric materials that are different from the a), b), c), d), and e) components defined above.

3. The lithographic printing plate precursor of claim 2, wherein the one or more f) non-free radically polymerizable polymeric materials are present in particulate form.

4. The lithographic printing plate precursor of claim 1, wherein the c) initiator composition comprises at least one onium salt that is capable of generating free radicals.

5. The lithographic printing plate precursor of claim 4, wherein the at least one onium salt is a diaryliodonium salt.

6. The lithographic printing plate precursor of claim 4, wherein the d) borate compound and the at least one onium salt are used are used as a common salt compound.

7. The lithographic printing plate precursor of claim 1, wherein, after infrared radiation exposure, the infrared radiation sensitive image-recording layer is developable on-press using a lithographic ink, a fountain solution, or a combination of a lithographic ink and a fountain solution.

8. The lithographic printing plate precursor of claim 1, wherein the infrared radiation-sensitive image-recording layer is the outermost layer.

9. The lithographic printing plate precursor of claim 1, wherein the infrared radiation-sensitive image-recording layer comprises at least two a) free radically polymerizable components.

10. The lithographic printing plate precursor of claim 1, wherein the substrate comprises an aluminum-containing substrate comprising an aluminum oxide layer, and a hydrophilic polymer coating that is disposed on the aluminum oxide layer.

11. The lithographic printing plate precursor of claim 1, wherein the e) compound capable of forming a colored boronic complex is represented by the following Structure (VI):

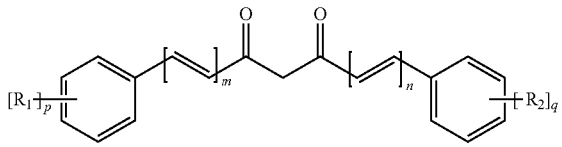

wherein $R_1$ and $R_2$ are independently a substituent selected from the group consisting of hydroxy, halogen, alkyl, alkoxy, alkylcarbonyl, alkylcarbonyloxy, alkoxycarbonyl, aryl, aryloxy, nitro, amino, alkylamino, dialkylamino, arylimino, diarylamino, and acetylamino groups, which substituent is positioned at any of the ortho, meta and para positions of the benzene ring to which it is attached; m and n are independently 0, 1, 2, or 3; and p and q are independently 0 to 5.

12. The lithographic printing plate precursor of claim 11, wherein the e) compound capable of forming a colored boronic complex comprises one or more of the following compounds:

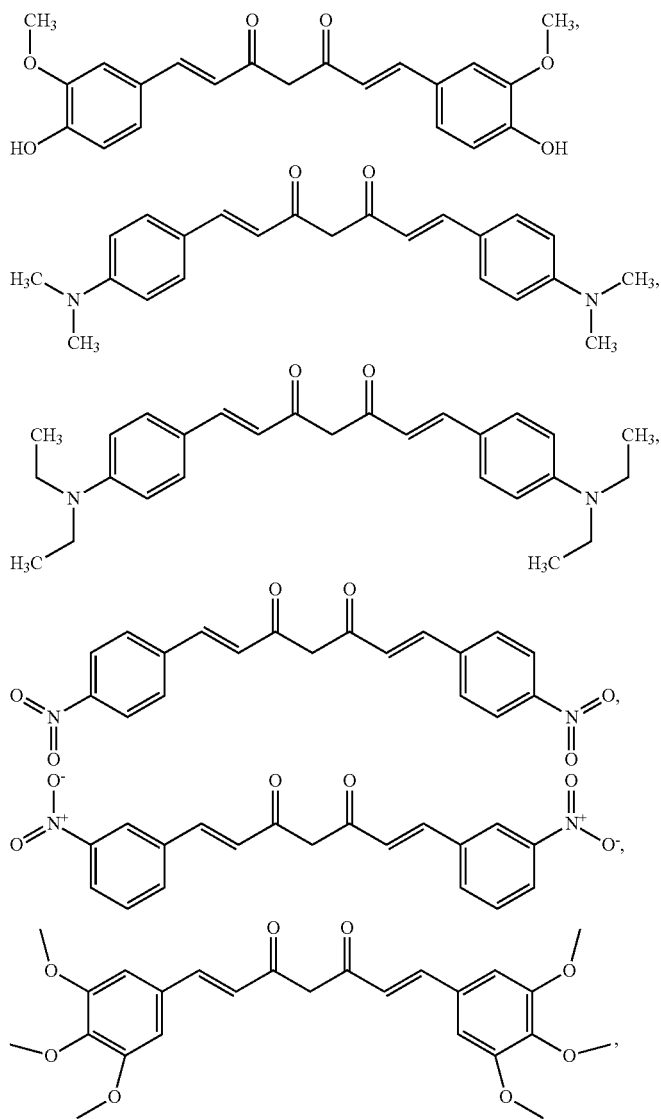

-continued
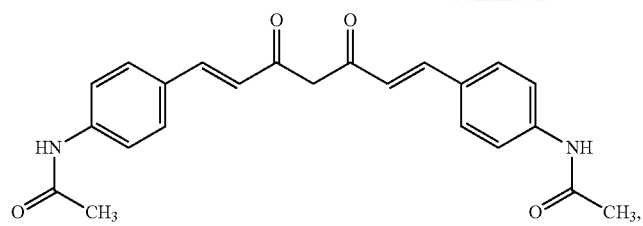
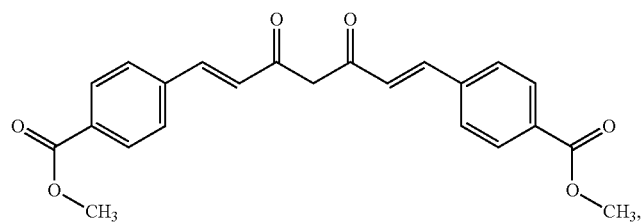
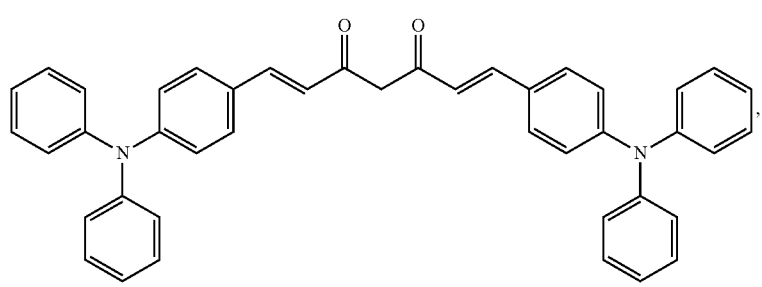
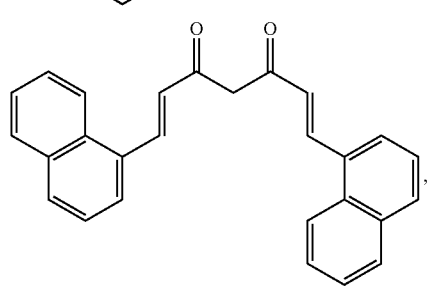
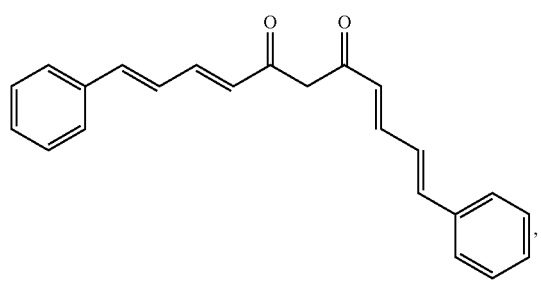
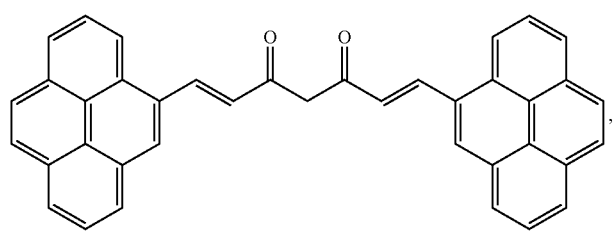

-continued

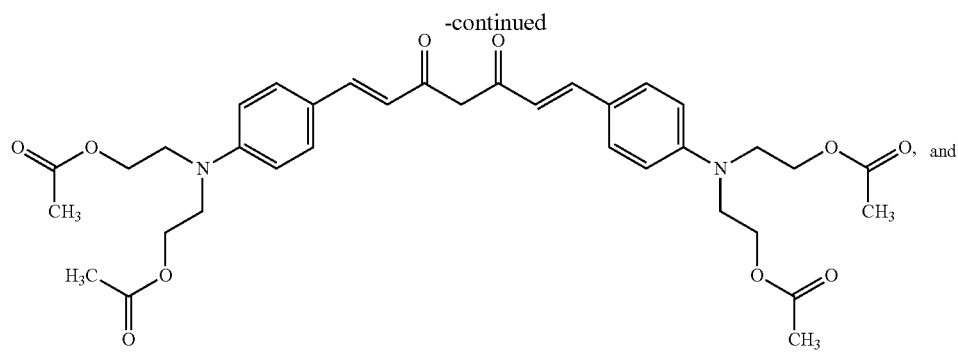

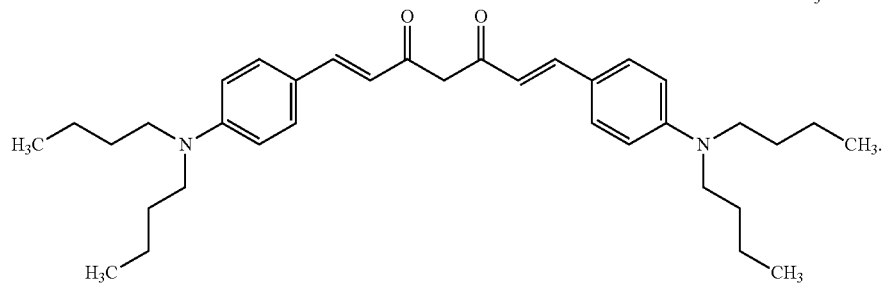

13. The lithographic printing plate precursor of claim 1, wherein the infrared radiation-sensitive image-recording layer further comprises one or more acid-sensitive dye precursors.

14. A method for providing a lithographic printing plate, comprising:
   A) imagewise exposing the lithographic printing plate precursor according to claim 1 to infrared radiation, to provide exposed regions and non-exposed regions in the infrared radiation-sensitive image-recording layer, and
   B) removing the non-exposed regions in the infrared radiation-sensitive image-recording layer from the substrate.

15. The method of claim 14, comprising removing the non-exposed regions in the infrared radiation-sensitive image-recording layer from the substrate on-press using a lithographic printing ink, a fountain solution, or a combination of a lithographic printing ink and a fountain solution.

16. The method of claim 14, wherein the imagewise exposure to infrared radiation forms a colored boronic complex in the exposed regions of the infrared radiation-sensitive image-recording layer.

17. The method of claim 16, wherein the colored boronic complex comprises one or more occurrences of the following substructure (IIIa), (IIIb), or (IIIc):

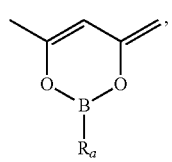

(IIIa)

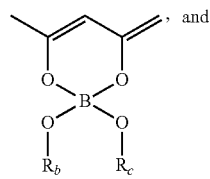

(IIIb)

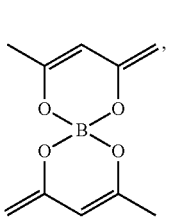

(IIIc)

wherein $R_a$ is one of $R^1$, $R^2$, $R^3$ and $R^4$ as defined above for structure (I) for the d) borate compound or $R_a$ is a —OH group; and $R_b$ and $R_c$ are a residue from the e) compound capable of forming a colored boronic complex.

* * * * *